(12) United States Patent
Uchida et al.

(10) Patent No.: US 6,336,107 B1
(45) Date of Patent: Jan. 1, 2002

(54) METHOD AND SYSTEM OF AUTOMATIC ARRANGEMENT OF COMPOSING ELEMENTS

(75) Inventors: Tomohiro Uchida, Kawasaki; Natsuki Oka, Tokyo; Hiroyuki Yoshimura, Ashiya, all of (JP)

(73) Assignee: Matsushita Electric Industrial Co., LTD, Osaka (JP)

(*) Notice: Subject to any disclaimer, the term of this patent is extended or adjusted under 35 U.S.C. 154(b) by 0 days.

(21) Appl. No.: 09/124,890

(22) Filed: Jul. 30, 1998

(30) Foreign Application Priority Data

Jul. 31, 1997 (JP) .............................................. 9-205653
Apr. 16, 1998 (JP) .......................................... 10-105989

(51) Int. Cl.[7] ................................................. G06N 3/04
(52) U.S. Cl. .......................................... 706/13; 706/12
(58) Field of Search ..................................... 706/12, 13

(56) References Cited

U.S. PATENT DOCUMENTS

| 4,881,178 A | | 11/1989 | Holland et al. | |
|---|---|---|---|---|
| 4,935,877 A | * | 6/1990 | Koza | 706/13 |
| 5,140,530 A | * | 8/1992 | Guha et al. | 706/13 |
| 5,343,554 A | * | 8/1994 | Koza et al. | 706/13 |
| 5,434,796 A | * | 7/1995 | Weininger | 706/13 |
| 5,867,397 A | * | 2/1999 | Koza et al. | 706/13 |
| 5,897,628 A | * | 4/1999 | Kitano | 706/13 |

FOREIGN PATENT DOCUMENTS

JP  5-342290  12/1993

OTHER PUBLICATIONS

"Genetic Algorithm" by Akihiro Kitano; first version published Jun. 3, 1993 (w/partial English translation).

"Approach from Artificial Intelligence to CAD of the Printed Circuit Board Design" by Yoshimura et al; The 10th Annual Conference of JSAI, 1996; pp., 1–15 (w/partial English translation).

\* cited by examiner

Primary Examiner—Kevin J. Teska
Assistant Examiner—Wilbert L. Starks, Jr.
(74) Attorney, Agent, or Firm—Israel Gopstein Clark & Brody

(57) ABSTRACT past positions of a plurality of composing elements indicated by various past arrangement examples are given to each potential function corresponding to one composing element, and parameter values of the potential functions corresponding to the composing elements are automatically set on condition that a past total potential energy obtained by solving the potential functions is minimized. Thereafter, the parameter values are given to the potential functions in which a position of any composing element is not determined, and particular positions of the composing elements are determined on condition that a total potential energy obtained by solving the potential functions is minimized. Because each potential function corresponding to one composing element has an attraction term indicating the attraction between the composing element and the other composing elements and an attraction-repulsion term indicating the setting of the composing element at a position spaced at moderate distances from the other composing elements, the particular positions of the composing elements are set in an optimum arrangement. Accordingly, the optimum arrangement of the composing elements can be automatically obtained without extracting any arrangement knowledge from a skilled person.

60 Claims, 11 Drawing Sheets

FIG. 5A

CLASSIFIER SYSTEM

| CLASSIFIER NO. | CLASSIFIERS (OR RULES) | | FITNESS (OR STRENGTH) |
| --- | --- | --- | --- |
| | CONDITION PART | ACTION PART | |
| 1 | 1 1 * * | 0 0 1 1 | 100 |
| 2 | 0 0 1 1 | 0 1 1 0 | 100 |
| 3 | 0 1 * * | 1 0 1 1 | 100 |
| 4 | * * 1 1 | 0 0 0 0 | 100 |

FIG. 5B

INITIAL CONDITION

RS1 : R1 | R2 R3 R4

RS2 : R5 R6 R7 | R8 R9 R10

ALIGNMENT

RS1 :       R1 | R2 R3 R4

RS2 : R5 R6 R7 | R8 R9 R10

AFTER CROSSING-OVER

| NO. | RULES | | FITNESS |
|---|---|---|---|
| | CONDITION PART | ACTION PART | |
| 1 | 1 1 * * | 0 0 1 1 | 100 |
| 2 | 0 0 1 1 | 0 1 1 0 | 100 |
| 3 | 0 1 * * | 1 0 1 1 | 100 |
| 4 | * * 1 1 | 0 0 0 0 | 100 |

INPUT CONDITION "1 1 1 0"
Ctax=0.1
→

| NO. | RULES | | FITNESS |
|---|---|---|---|
| | CONDITION PART | ACTION PART | |
| 1 | 1 1 * * | 0 0 1 1 | 90 |
| 2 | 0 0 1 1 | 0 1 1 0 | 100 |
| 3 | 0 1 * * | 1 0 1 1 | 100 |
| 4 | * * 1 1 | 0 0 0 0 | 100 |

FIG. 5D

| NO. | RULES | | FITNESS |
|---|---|---|---|
| | CONDITION PART | ACTION PART | |
| 1 | 1 1 * * | 0 0 1 1 | 90 |
| 2 | 0 0 1 1 | 0 1 1 0 | 100 |
| 3 | 0 1 * * | 1 0 1 1 | 100 |
| 4 | * * 1 1 | 0 0 0 0 | 100 |

→

| NO. | RULES | | FITNESS | BID |
|---|---|---|---|---|
| | CONDITION PART | ACTION PART | | |
| 1 | 1 1 * * | 0 0 1 1 | 90 | |
| 2 | 0 0 1 1 | 0 1 1 0 | 90 | 10 |
| 3 | 0 1 * * | 1 0 1 1 | 100 | |
| 4 | * * 1 1 | 0 0 0 0 | 90 | 10 |

↓

| NO. | RULES | | FITNESS |
|---|---|---|---|
| | CONDITION PART | ACTION PART | |
| 1 | 1 1 * * | 0 0 1 1 | 110 |
| 2 | 0 0 1 1 | 0 1 1 0 | 90 |
| 3 | 0 1 * * | 1 0 1 1 | 100 |
| 4 | * * 1 1 | 0 0 0 0 | 90 |

FIG. 7A

| NO. | CLASSIFIERS (OR RULES) | | FITNESS |
|---|---|---|---|
| | CONDITION PART | ACTION PART | |
| 1 | $Rc_{11}$ | $Ra_{11}$ | $F_{11}$ |
| 2 | $Rc_{12}$ | $Ra_{12}$ | $F_{12}$ |
| 3 | $Rc_{13}$ | $Ra_{13}$ | $F_{13}$ |
| ⋮ | ⋮ | ⋮ | ⋮ |
| n | $Rc_{1n}$ | $Ra_{1n}$ | $F_{1n}$ |

FIG. 7B

| NO. | CLASSIFIERS (OR RULES) | | FITNESS |
|---|---|---|---|
| | CONDITION PART | ACTION PART | |
| 1 | $Rc_{21}$ | $Ra_{21}$ | $F_{21}$ |
| 2 | $Rc_{22}$ | $Ra_{22}$ | $F_{22}$ |
| 3 | $Rc_{23}$ | $Ra_{23}$ | $F_{23}$ |
| ⋮ | ⋮ | ⋮ | ⋮ |
| n | $Rc_{2n}$ | $Ra_{2n}$ | $F_{2n}$ |

FIG. 7C

| NO. | CLASSIFIERS (OR RULES) | | FITNESS |
|---|---|---|---|
| | CONDITION PART | ACTION PART | |
| 1 | $Rc_{31}$ | $Ra_{31}$ | $F_{31}$ |
| 2 | $Rc_{32}$ | $Ra_{32}$ | $F_{32}$ |
| 3 | $Rc_{33}$ | $Ra_{33}$ | $F_{33}$ |
| ⋮ | ⋮ | ⋮ | ⋮ |
| n | $Rc_{3n}$ | $Ra_{3n}$ | $F_{3n}$ |

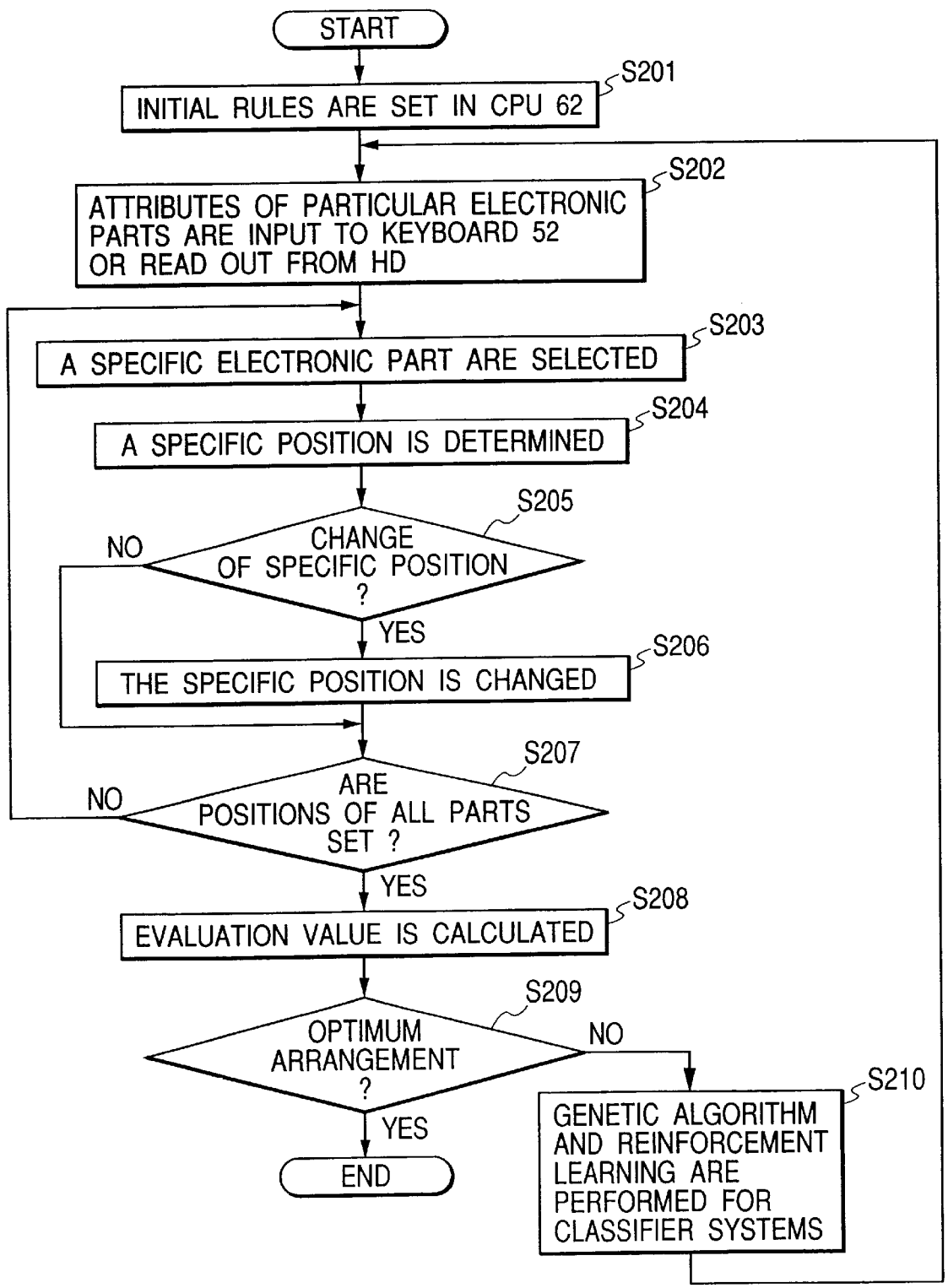

FIG. 10A

FIRST CLASSIFIER SYSTEM

|  | CONDITION PART | ACTION PART | FITNESS |
|---|---|---|---|
| RULE 1; | 1 3 1 1 2 2 1 | 0 | 200 |
| RULE 2; | 1 6 1 * * 2 2 | 7 | 200 |
| RULE 3; | 2 4 * * 2 2 * | 4 | 100 |
| RULE 4; | 1 5 1 1 1 * 2 | 1 | 100 |
| RULE 5; | 2 * * * * * | 8 | 50 |
| RULE 6; | 1 * * * * * | 2 | 50 |
| ⋮ | ⋮ | ⋮ | ⋮ |

SECOND CLASSIFIER SYSTEM

|  | CONDITION PART | ACTION PART | FITNESS |
|---|---|---|---|
| RULE 1; | 1 2 1 1 1 * * | 3 | 200 |
| RULE 2; | 1 3 * * * * * | 3 | 100 |
| RULE 3; | 1 5 1 1 2 2 2 | 1 | 100 |
| RULE 4; | 1 5 1 1 2 2 2 | 2 | 50 |
| RULE 5; | 2 * * * * * | 3 | 50 |
| ⋮ | ⋮ | ⋮ | ⋮ |

THIRD CLASSIFIER SYSTEM

|  | CONDITION PART | ACTION PART | FITNESS |
|---|---|---|---|
| RULE 1; | 1 0 | 1 | 400 |
| RULE 2; | 1 2 | 2 | 100 |
| RULE 3; | 2 0 | 2 | 100 |
| ⋮ | ⋮ | ⋮ | ⋮ |

FIG. 10B

FIRST CLASSIFIER SYSTEM

| | CONDITION PART | ACTION PART | FITNESS |
|---|---|---|---|
| RULE 1; | 1 3 1 1 2 2 1 | 0 | 200 |
| RULE 2; | 1 6 1 * * 2 2 | 7 | 200 |
| RULE 3; | 2 4 * * 2 2 * | 4 | 100 |
| RULE 4; | 1 5 1 1 1 * 2 | 1 | 100 |
| RULE 5; | 2 * * * * * * | 8 | 50 |
| RULE 6; | 1 * * * * * * | 2 | 50 |

⇒

RULE 1; 1 3 1 1 2 2 1 0

RULE 4; 1 5 1 1 1 * 2 1

⇓

CROSSOVER POINT

RULE 1; 1 3 1 | 1 2 2 1 0

RULE 4; 1 5 1 | 1 1 * 2 1

⇩ CROSSOVER

RULE 1; 1 3 1 1 1 * 2 1

RULE 4; 1 5 1 1 2 2 1 0

⇐

FIRST CLASSIFIER SYSTEM

| | CONDITION PART | ACTION PART | FITNESS |
|---|---|---|---|
| RULE 1; | 1 3 1 1 1 * 2 | 1 | 200 |
| RULE 2; | 1 6 1 * * 2 2 | 7 | 200 |
| RULE 3; | 2 4 * * 2 2 * | 4 | 100 |
| RULE 4; | 1 5 1 1 2 2 1 | 0 | 100 |
| RULE 5; | 2 * * * * * * | 8 | 50 |
| RULE 6; | 1 * * * * * * | 2 | 50 |

METHOD AND SYSTEM OF AUTOMATIC ARRANGEMENT OF COMPOSING ELEMENTS

BACKGROUND OF THE INVENTION

1. Field of the Invention

The present invention relates to an automatic arrangement method and an automatic arrangement system in which arrangement knowledge of a plurality of composing elements is automatically obtained from past arrangement examples of the composing elements to determine an optimum (or appropriate) arrangement of the composing elements according to the arrangement knowledge of the composing elements. Also, the present invention relates to a recording medium in which a computer program indicating an automatic arrangement of a plurality of composing elements is recorded to perform the automatic arrangement of the composing elements in a computer.

2. Description of the Related Art

In cases where the number of composing elements is small and restriction for the composing elements is simple, the automatic arrangement of the composing elements can be easily performed. However, in cases where the number of composing elements is large and restriction for the composing elements is complicated, because it is difficult to automatically arrange the composing elements in an appropriate arrangement, the composing elements are manually arranged by a skilled person. As an example of the arrangement of composing elements, the arrangement of composing parts on a printed circuit board (PCB) is known. In this arrangement, an automatic parts arrangement system is used for the composing parts. However, because it is difficult to appropriately arrange the composing parts, the composing parts are manually arranged by a skilled person.

2.1. PREVIOUSLY PROPOSED ART

As an example of the automatic parts arrangement system, an automatic parts arrangement system (H. Yoshimura, S. Miura "Approach from Artificial Intelligence to CAD of the PCB Design" the 10th Annual Conference of JSAI, 1996) is known. In this system, knowledge of composing parts arrangement is extracted from a skilled person by interviewing with the skilled person, the extracted knowledge is reflected on the automatic parts arrangement system, and a plurality of composing parts are automatically arranged on a PCB.

Also, a published unexamined Japanese Patent Application No. H5-342290 "METHOD AND DEVICE FOR ARRANGING ELEMENTS" is disclosed. In this application, attraction and repulsion occurring between elements are calculated, and the position of each element is changed for each minute time according to a sum of the attraction and the repulsion.

2.2. PROBLEMS TO BE SOLVED BY THE INVENTION

However, even though a plurality of composing parts are automatically arranged on a PCB while reflecting knowledge extracted from a skilled person on the automatic parts arrangement system, there is a problem that the arrangement of the composing parts satisfying the skilled person cannot be always obtained. That is, the skilled person has knowledge unconsciously used as well as knowledge consciously used, the knowledge consciously used cannot be extracted by interviewing with the skilled person, so that the knowledge extracted from the skilled person are not sufficient to appropriately arrange the composing parts on the PCB. In particular, because a density of wirings on the PCB and a density of parts attached on the printing substrate have been recently heightened, there is little space between the composing parts on the PCB, it is required that the skilled person performs the trial and error operation many times to appropriately arrange the composing parts on the PCB. Therefore, the knowledge of the skilled person has been more complicated, so that the extraction of the knowledge from the skilled person becomes more difficult. As a result, the composing parts cannot be appropriately arranged on the PCB in a conventional automatic arrangement system according to a conventional automatic arrangement method performed by extracting the knowledge of the parts arrangement from the skilled person.

Also, in cases where elements are arranged according to the method and device for arranging elements disclosed in the published unexamined Japanese Patent Application No. H5-342290, it is required that a function for calculating the attraction and repulsion is prepared in advance, so that there is a problem that a technical knowledge is required for an element arrangement designer to determine the function.

SUMMARY OF THE INVENTION

An object of the present invention is to provide, with due consideration to the drawbacks of such a conventional automatic arrangement method and a conventional automatic arrangement system, an automatic arrangement method and an automatic arrangement system in which positions of a plurality of composing elements are automatically set in an optimum (or appropriate) arrangement without extracting knowledge of element arrangement from a skilled person.

Also, the object is to provide a recording medium for recording a computer program indicating the automatic arrangement method.

The object is achieved by the provision of an automatic arrangement method, comprising the steps of:

preparing a plurality of past examples respectively indicating a past arrangement of a set of composing elements, each past example of composing elements being composed of position information indicating positions of the composing elements and attribute information indicating attributes of the composing elements;

preparing a potential function indicating a potential energy of one composing element;

selecting a plurality of particular past examples corresponding to a plurality of particular composing elements from the past examples;

automatically determining values of one or more parameters included in the potential function according to the particular past examples for each particular composing element;

differentiating each of the potential functions to obtain a force exerted on each particular composing element;

changing a position of each particular composing element according to the force to decrease a total potential energy obtained by summing up the potential energies of the particular composing elements, each potential energy of one particular composing element being obtained by determining a position of the particular composing element in one potential function; and setting a particular arrangement of the composing elements placed at the changed positions.

In the above steps, in cases where a plurality of particular composing elements are arranged to minimize a sum of a plurality of potential energies obtained by solving a plurality of potential functions corresponding to the particular composing elements, positions of the particular composing elements are set in an optimum (or appropriate) arrangement. Because parameters included in each potential function are automatically determined according to the particular past examples, it is not required to extract knowledge of element arrangement from a skilled person for the purpose of setting the particular composing elements in an optimum arrangement.

Also, because a force exerted on each particular composing element is obtained by differentiating each potential function and a position of each particular composing element is changed according to the force to decrease the sum of the potential energies, the positions of the particular composing elements can be set in an optimum arrangement.

The object is also achieved by the provision of an automatic arrangement method, comprising the steps of:

preparing a plurality of past examples respectively indicating a past arrangement of a set of composing elements, each past example of one set of composing elements being composed of past position information indicating past positions of the composing elements, past attribute information indicating attributes of the composing elements and past connection information indicating a direct connection of each composing element with other composing elements or another composing element;

preparing a prototype of a total potential function indicating a total potential energy of a plurality of composing elements in a potential field made by the composing elements;

inputting particular element information of a plurality of particular composing elements, the particular element information being composed of particular attribute information indicating attributes of the particular composing elements and particular connection information indicating a direct connection of each particular composing element with other particular composing elements or another particular composing element;

selecting a plurality of particular past examples corresponding to the particular composing elements from the past examples, the particular past examples being composed of particular past position information of the particular composing elements, particular past attribute information of the particular composing elements and particular past connection information of the particular composing elements;

producing a total past potential function corresponding to the particular composing elements from the prototype of the total potential function according to the particular past attribute information and the particular past connection information of the particular past examples;

setting values of one or more parameters include in the total past potential function as a set of parameter values;

calculating a total past potential energy of the particular composing elements from the total past potential function by giving one set of parameter values to the total past potential function to determine an equation of the total past potential function and giving particular past positions of the particular composing elements indicated by the particular past position information of the particular past examples to the equation of the total past potential function to solve the equation of the total past potential function each time the set of parameter values is set while changing the parameter values;

determining a particular set of parameter values on condition that the total past potential energy calculated according to the particular set of parameter values is minimized;

producing a total potential function corresponding to the particular composing elements from the prototype of the total potential function according to the particular attribute information and the particular connection information of the particular element information;

giving the particular set of parameter values to the total potential function to determine a particular equation of the total potential function;

determining a particular set of positions of the particular composing elements on condition that a particular total potential energy of the particular composing elements obtained from the particular equation of the total potential function is minimized by giving the particular set of positions to the particular equation of the total potential function; and adopting a particular arrangement of the particular composing elements determined by the particular set of positions of the particular composing elements as an optimum arrangement of the particular composing elements.

The object is also achieved by the provision of an automatic arrangement system, comprising:

past example storing means for storing a plurality of past examples respectively indicating a past arrangement of a set of composing elements, each past example of one set of composing elements being composed of past position information indicating past positions of the composing elements, past attribute information indicating attributes of the composing elements and past connection information indicating a direct connection of each composing element with other composing elements or another composing element;

total potential function storing means for storing a prototype of a total potential function indicating a total potential energy of a plurality of composing elements in a potential field made by the composing elements;

element information receiving means for receiving particular element information of a plurality of particular composing elements, the particular element information being composed of particular attribute information indicating attributes of the particular composing elements and particular connection information indicating a direct connection of each particular composing element with other particular composing elements or another particular composing element;

past example selecting means for selecting a plurality of particular past examples corresponding to the particular composing elements received by the element information receiving means from the past examples stored in the past example storing means, the particular past examples being composed of particular past position information of the particular composing elements, particular past attribute information of the particular composing elements and particular past connection information of the particular composing elements;

parameter value determining means for producing a total past potential function corresponding to the particular composing elements received by the element information receiving means from the prototype of the total potential function stored in the total potential function storing means according to the particular past attribute information and the particular past connection information of the particular past examples, setting values of one or more parameters included in the total past potential function as a set of parameter values each time the parameter values are changed, determining an equation of the total past potential function by giving one set of parameter values to the total past potential function, calculating a total past potential energy of the particular composing elements from the equation of the total past potential function by giving particular past positions of the particular composing elements indicated by the particular past position information of the particular past examples to the equation of the total past potential function each time the parameter values are changed, and determining a particular set of parameter values on condition that the total past potential energy calculated according to the particular set of parameter values is minimized; and optimum arrangement determining means for producing a total potential function corresponding to the particular composing elements received by the element information receiving means from the prototype of the total potential function stored in the total potential function storing means according to the particular attribute information and the particular connection information of the particular element information received by the element information receiving means, giving the particular set of parameter values determined by the parameter value determining means to the total potential function to determine a particular equation of the total potential function, determining a particular set of positions of the particular composing elements on condition that a particular total potential energy of the particular composing elements obtained from the particular equation of the total potential function is minimized by giving the particular set of positions to the particular equation of the total potential function, and adopting a particular arrangement of the particular composing elements determined by the particular set of positions of the particular composing elements as an optimum arrangement of the particular composing elements.

In the above steps and configuration, because a plurality of particular past examples corresponding to a plurality of particular composing elements specified by an operator are selected from the past examples and a particular set of parameter values to be given to a total potential function is determined according to the particular past examples, it is not required to extract knowledge of element arrangement from a skilled person for the purpose of setting the particular composing elements in an optimum (or appropriate) arrangement.

Also, because a total potential energy of the particular composing elements is calculated from the total potential function by giving the particular set of parameter values and particular element information input by the operator to the total potential function, an optimum arrangement of the particular composing elements can be automatically set on condition that the particular composing elements are arranged to minimize the total potential energy.

The object is also achieved by the provision of a recording medium for recording a computer program indicating an automatic arrangement of a plurality of composing elements to perform the automatic arrangement of the composing elements in a computer by reading out the computer program from the recording medium, the computer program comprises the steps of:

automatically determining values of one or more parameters included in a potential function corresponding one composing element according to a past arrangement example for each composing element;

differentiating each potential function to obtain a force exerted on each composing element;

changing a position of each composing element according to the force to decrease a total potential energy of the composing elements; and setting a particular arrangement of the composing elements placed at the changed positions.

In the above recording medium, because a computer program indicating the automatic arrangement method is recorded, when the computer program is read out from the recording medium in a computer, the composing elements can be set to an optimum arrangement.

Also, the object is achieved by the provision of an automatic arrangement method, comprising the steps of:

determining an arranging order of a plurality of composing elements in a first classifier system according to attributes of the composing elements and one or more connection conditions among the composing elements;

determining an arranging position determining method for each composing element in the arranging order of the composing elements in a second classifier system according to the attributes of the composing elements and the connection conditions among the composing elements;

determining an arranged position of each composing element in an arrangement area or an area surrounding the arrangement area according to the arranging position determining method determined for the composing element in the arranging order of the composing elements;

judging in a third classifier system whether or not the change of the arranged position of each composing element is required according to the attributes and arranged positions of the composing elements and the connection conditions among the composing elements in the arranging order of the composing elements;

detecting a position changing method for one composing element in the third classifier system in cases where it is judged that the change of the arranged position of the composing element is required; and changing the arranged position of one composing element according to the position changing method for the composing element, in cases where it is judged that the change of the arranged position of the composing element is required, to set the arranged positions of the composing elements in an optimum arrangement in the arrangement area.

The object is also achieved by the provision of an automatic arrangement system, comprising:

element information receiving means for receiving element information indicating a plurality of composing elements;

composing element storing means for storing one or more attributes of each composing element received by the element information receiving means;

composing element arranging order determining means, having a first classifier system, for determining an arranging order of the composing elements received by the element information receiving means in the first classifier system according to the attributes of the composing elements stored in the composing element storing means;

arranging position determining means, having a second classifier system, for determining an arranging position determining method for each composing element in the arranging order of the composing elements in the second classifier system according to the attributes of the composing elements and determining an arranged position of each composing element in an arrangement area or an area surrounding the arrangement area according to the arranging position determining method determined for the composing element in the arranging order of the composing elements;

arranged position change judging means, having a third classifier system, for judging in the third classifier system whether or not the change of the arranged position of each composing element is required according to the attributes and arranged positions of the composing elements in the arranging order of the composing elements and producing a position changing method for one composing element in the third classifier system in cases where it is judged that the change of the arranged position of the composing element is required; and composing element arranging means for changing the arranged position of one composing element according to the position changing method for the composing element, in cases where it is judged in the third classifier system that the change of the arranged position of the composing element is required, to set the arranged positions of the composing elements in an optimum arrangement in the arrangement area.

In the above steps and configuration, an arranging order of a plurality of composing elements is determined in the first classifier system. Thereafter, an arranging position determining method of each composing element is determined in the second classifier system in the arranging order, an arranged position of each composing element is determined according to the arranging position determining method in the arranging order, and whether or not the change of the arranged position of each composing element is required is judged in the third classifier system in the arranging order, and the arranged position of one composing element is changed according to a position changing method in cases where the change of the arranged position of the composing element is required.

Accordingly, the arranged positions of the composing elements can be set in an optimum arrangement in the arrangement area without extracting knowledge of element arrangement from a skilled person.

The object is also achieved by the provision of a recording medium for recording a computer program indicating an automatic arrangement of a plurality of composing elements to perform the automatic arrangement of the composing elements in a computer by reading out the computer program from the recording medium, the computer program comprises the steps of:

determining an arranging order of a plurality of composing elements in a first classifier system according to attributes of the composing elements and one or more connection conditions among the composing elements;

determining an arranging position determining method for each composing element in the arranging order of the composing elements in a second classifier system according to the attributes of the composing elements and the connection conditions among the composing elements;

determining an arranged position of each composing element in an arrangement area or an area surrounding the arrangement area according to the arranging position determining method determined for the composing element in the arranging order of the composing elements;

judging in a third classifier system whether or not the change of the arranged position of each composing element is required according to the attributes and arranged positions of the composing elements and the connection conditions among the composing elements in the arranging order of the composing elements;

detecting a position changing method for one composing element in the third classifier system in cases where it is judged that the change of the arranged position of the composing element is required; and changing the arranged position of one composing element according to the position changing method for the composing element, in cases where it is judged that the change of the arranged position of the composing element is required, to set the arranged positions of the composing elements in an optimum arrangement in the arrangement area.

In the above recording medium, because a computer program indicating the automatic arrangement method is recorded, when the computer program is read out from the recording medium in a computer, the composing elements can be set to an optimum arrangement.

BRIEF DESCRIPTION OF THE DRAWINGS

The objects, features and advantages of the present invention will be apparent from the following description taken in conjunction with the accompanying drawings, in which:

FIG. 5A shows a fundamental configuration of a classifier system;

FIG. 5B shows the crossover in a Pitts approach in which a plurality of chromosomes (or classifier systems) are crossed with each other as one process of a genetic algorithm;

FIGS. 5C and 5D show the adjustment of a fitness value of a rule in a reinforcement learning;

FIG. 7A shows the configuration of a first classifier system;

FIG. 7B shows the configuration of a second classifier system;

FIG. 7C shows the configuration of a third classifier system;

FIG. 9 shows a flow chart of an automatic arrangement of a plurality of electronic parts on a PCB according to the automatic arrangement method;

FIG. 10A shows an example of the configuration of the first, second and third classifier systems in which initial coded rules are set; and FIG. 10B shows the crossover performed for rules of the first classifier system shown in FIG. 10A as one process of the genetic algorithm.

DETAILED DESCRIPTION OF THE EMBODIMENTS

Preferred embodiments of an automatic arrangement method and an automatic arrangement system according to the present invention are described with -reference to the drawings.

(First Embodiment)

Figure 1:
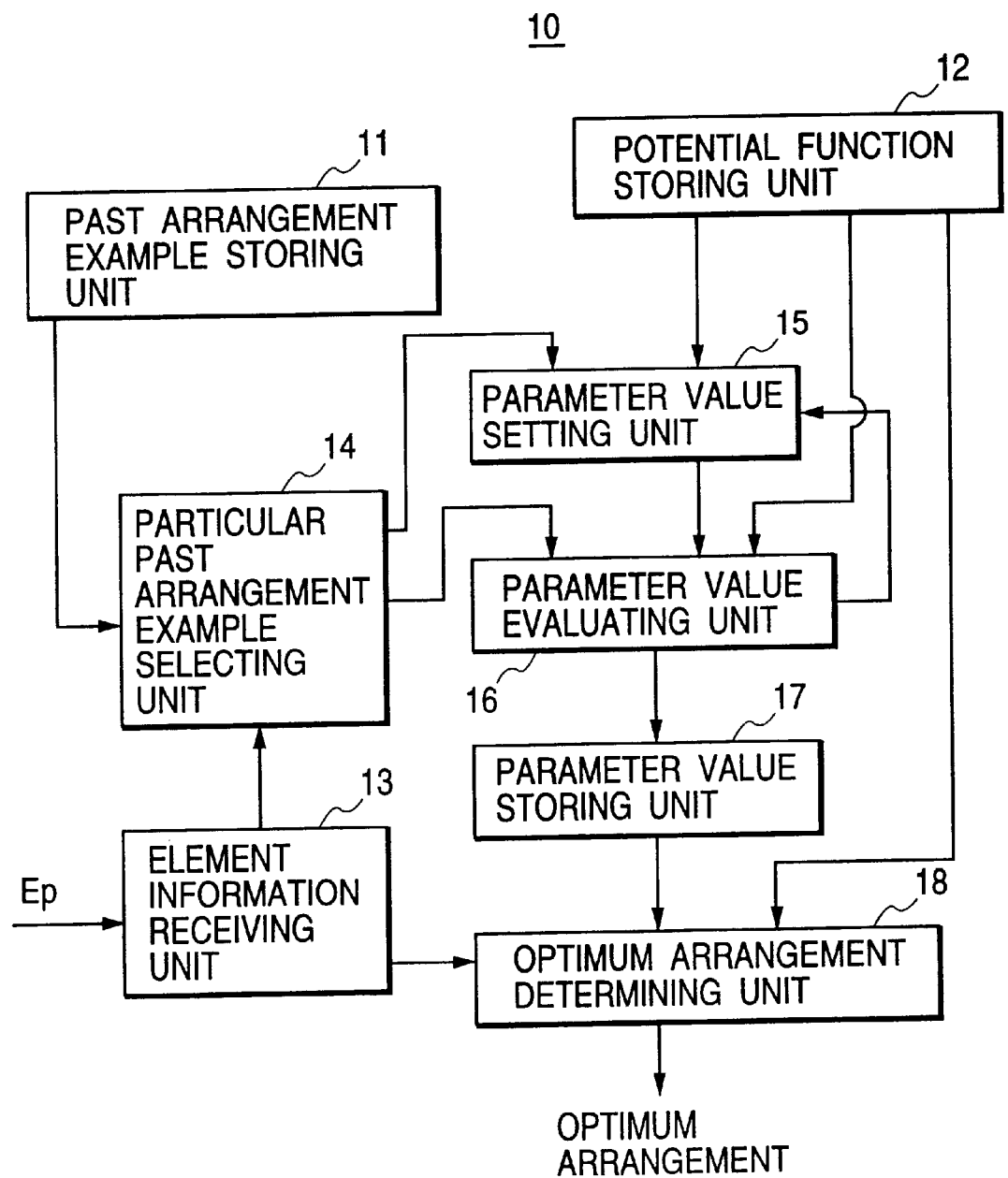
FIG. 1 is a block diagram of an automatic arrangement system according to a first embodiment of the present invention.

FIG. 1 is a block diagram of an automatic arrangement system according to a first embodiment of the present invention.

As shown in FIG. 1, an automatic arrangement system 10 comprises:

a past arrangement example storing unit 11 for storing a past arrangement example of the composing elements for each of a plurality of sets of composing elements, each past arrangement example for a set of composing elements being composed of position information of each composing element, attribute information of each composing element and connection information indicating a direct connection of each composing element to another composing element or other composing elements;

a potential function storing unit 12 for storing a prototype of a total potential function composed of a plurality of prototypes of potential functions corresponding to a plurality of composing elements, each prototype of the potential function corresponding to one composing element Ec1 being composed of both an attraction term expressing an attraction between the composing element Ec1 and another composing elements Ec2 or a group of other composing elements Ec2 connected with the composing element Ec1 and an attraction-repulsion term functioning to place the other composing elements Ec2 at appropriate distances from the composing element Ec1;

an element information receiving unit 13 for receiving particular element information indicating an initial arrangement of a plurality of particular composing elements Ep to determine an optimum (or appropriate) arrangement of the particular composing elements CEp, the particular element information being composed of initial position information of the particular composing elements CEp, particular attribute information of the particular composing elements CEp and particular connection information indicating a direct connection of each particular composing element CEp1 with other particular composing elements CEp2 (or another particular composing element CEp2);

a particular past arrangement example selecting unit 14 for selecting one or more particular past arrangement examples respectively corresponding to one particular composing element CEp1 connected with other particular composing elements CEp2 (or another particular composing element CEp2), which agree with a plurality of particular composing elements CEp of the particular element information, from the past arrangement examples of the storing unit 11 for each of the particular composing elements CEp1 of the particular element information, the particular past arrangement examples of each particular composing element CEp1 indicating the positional relationship between the particular composing element CEp1 and all particular composing elements CEp2 connected with the particular composing element CEp1;

a parameter value setting unit 15 for setting values of one or more parameters used in each potential function corresponding to one particular composing element CEp1 according to the particular past arrangement examples of the particular composing element CEp1 and outputting a set of parameter values for each particular composing element CEp1;

a parameter value evaluating unit 16 for determining the attraction terms and the attraction-repulsion terms of the prototype of the total potential function corresponding to the particular composing elements CEp according to the position information, the attribute information and the connection information of the particular past arrangement examples to obtain a total past potential function, controlling the parameter value setting unit 15 to repeatedly calculate and output one set of parameter values for each particular composing element CEp1 while changing the parameter values within a prescribed changing range, giving one set of parameter values to the total past potential function for each particular composing element CEp1 to determine an equation of the total past potential function, obtaining a past potential energy by solving the equation of the total past potential function each time one set of parameter values is given to the total potential function for each particular composing element CEp1, determining particular sets of parameter values corresponding to the particular composing elements CEp1 which minimize the potential energy, and evaluating the particular sets of parameter values as an optimum set of parameter values;

a parameter value storing unit 17 for storing the particular sets of parameter values; and an optimum arrangement determining unit 18 for determining a total potential function corresponding to the particular composing elements CEp indicated by the particular element information by giving the particular attribute information and the particular connection information of the particular element information, determining an equation of the total potential function by giving the particular sets of parameter values stored in the parameter value storing unit 17 to the total potential function, initially calculating a total potential energy of the particular composing elements CEp by giving a plurality of positions of the particular composing elements CEp indicated by the initial position information of the particular element information to the equation of the total potential function and solving the equation of the total potential function, performing the calculation of the total potential energy each time the positions of the particular composing elements CEp are changed, determining a particular arrangement of the particular composing elements CEp as an optimum arrangement on condition that the total potential energy is minimized in cases where the particular composing elements CEp are placed at particular positions corresponding to the particular arrangement, and outputting the optimum arrangement of the particular composing elements CEp.

In the above configuration of the automatic arrangement system 10, an operation according to an automatic arrangement method is described.

A plurality of past arrangement examples are stored in the storing unit 11 in advance. Each past arrangement example corresponding to a set of composing elements is composed of pieces of position information indicating positions of the composing elements connected with each other, pieces of attribute information indicating a plurality of attributes of the composing elements and pieces of connection information indicating a direct connection relationship among the composing elements. Also, a prototype of a total potential function corresponding to a plurality of composing elements is stored in the storing unit 12 in advance. The prototype of the total potential function is classified into a plurality of prototypes of potential functions corresponding to a plurality of composing elements, and one or more parameters are used for each prototype of the potential function.

When an operator inputs particular element information indicating a plurality of particular composing elements CEp to the receiving unit 13, one or more particular past arrangement examples respectively corresponding to the same particular composing element CEp1 connected with a group of other particular composing elements CEp2 (or another particular composing element EP2) are selected by the selecting unit 14 from the past arrangement examples of the storing unit 11 for each of the particular composing elements CEp1. The particular element information is composed of particular position information indicating an initial arrangement of the particular composing elements CEp, particular attribute information indicating attributes of the particular composing elements CEp and particular connection information indicating a direct connection relationship among the particular composing elements CEp.

Thereafter, values of the parameters used in each of a plurality of potential functions corresponding to the particular composing elements CEp1 are set within a prescribed changing range in the setting unit 15. Thereafter, the attraction terms and the attraction-repulsion terms of the prototype of the total potential function corresponding to the particular composing elements CEp1 are determined in the evaluating unit 16 by giving the attributes of the particular composing elements CEp1 and the direct connection relationship among the particular composing elements CEp1 indicated by the particular past arrangement examples to the prototype of the total potential function. Therefore, the total potential function is determined.

Thereafter, one set of parameter values set by the setting unit 15 is given to the total potential function for each particular composing element CEp1 to determine an equation of the total potential function, and a total potential energy is obtained by giving the positions of the particular composing elements CEp to the equation of the total potential function and solving the equation of the total potential function. The total potential energy is obtained each time one set of parameter values is changed and given to the total potential function. Thereafter, a particular set of parameter values which minimize the potential energy is determined, and the particular set of parameter values is evaluated by the evaluating unit 16 as an optimum set of parameter values.

Thereafter, in the optimum arrangement determining unit 18, a total potential function corresponding to the particular composing elements CEp is determined from the prototype of the total potential function by giving the particular attribute information and the particular connection information of the particular element information to the prototype of the total potential function, an equation of the total potential function is determined by giving the particular set of parameter values to the total potential function, a potential energy is initially obtained by giving initial positions of the particular composing elements CEp to the equation of the total potential function and solving the equation of the total potential function. The potential energy is obtained each time the positions of the particular composing elements CEp are changed, and a particular arrangement of the particular composing elements CEp is determined as an optimum arrangement on condition that the potential energy is minimized in cases where the particular composing elements CEp are placed at particular positions corresponding to the particular arrangement. The optimum arrangement of the particular composing elements CEp is output.

Therefore, an optimum arrangement of the particular composing elements CEp can be automatically determined according to the particular past arrangement examples corresponding to the particular composing elements CEp1.

Next, an example that a plurality of electronic parts (equivalent to composing elements) are automatically arranged on a printed circuit board (PCB) according to the automatic arrangement method by using the automatic arrangement system 10 is described with reference to FIG. 2.

Figure 2:
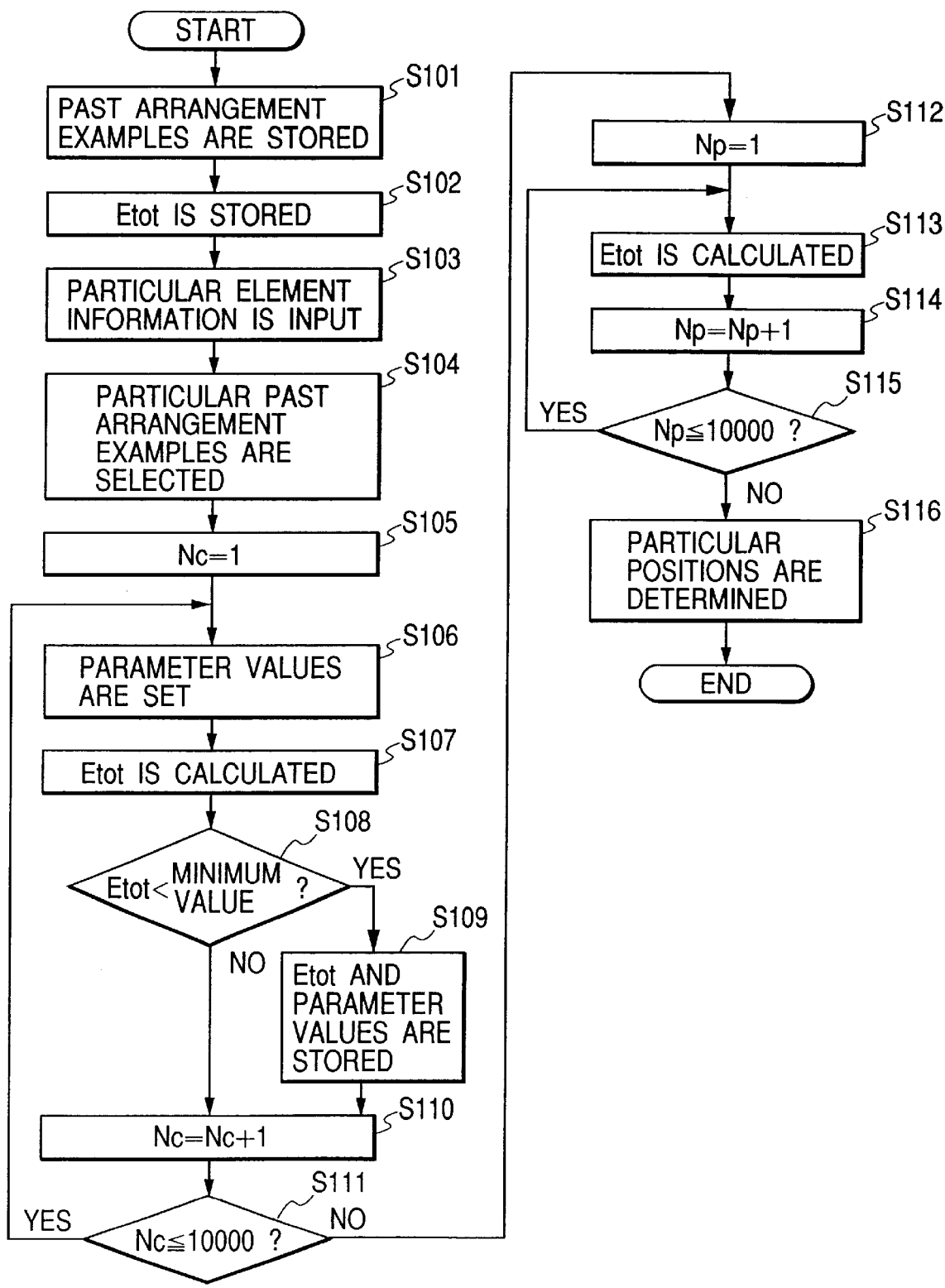
FIG. 2 shows a flow chart of an automatic arrangement of a plurality of electronic parts on a PCB according to the first embodiment.

FIG. 2 shows a flow chart of an automatic arrangement of a plurality of electronic parts on a PCB.

As shown in FIG. 2, in a step S101, a plurality of past arrangement examples corresponding to a plurality of sets of electronic parts are stored in the storing unit 11. Position information of one electronic part in each past arrangement example indicates co-ordinates of the electronic part. Attribute information of one electronic part in each past arrangement example indicates attributes such as a part number specifying the electronic part, a type of the electronic part, a shape of the electronic part, the weight of the electronic part, the number of connection terminals (or pins) attached to the electronic part and the like. One or more connection terminals of one electronic part are connected with one or more connection terminals of another electronic part through one or more wirings. Connection information of one electronic part Pi in each past arrangement example indicates one or more part numbers of other electronic parts Pj directly connected with the electronic part Pi through one or more wirings and the number $Net_{ij}$ of wirings directly connecting the electronic part Pi and each electronic part Pj.

In a step S102, a prototype of a total potential function $E_{tot}$ composed of a plurality of prototypes of potential functions Ei corresponding to a plurality of electronic parts Pi is stored in the storing unit 12 to calculate a total potential energy Etot which is obtained by determining a plurality of potential functions Ei corresponding to the electronic parts Pi from the prototypes of potential functions Ei, calculating a plurality of potential energies Ei corresponding to the electronic parts Pi by solving the potential functions Ei and summing the potential energies Ei. The prototype of functions $E_{tot}$ and Ei are expressed as follows.

$$E_{tot} = \sum_i Ei \quad (1)$$

$$Ei = 1/2 * \alpha_i * \sum_{j \neq i} (Net_{ij} * r_{ij}) + 1/2 * \beta_i * \sum_{j \neq i} \{(\gamma_i/r_{ij})^{12} - (\gamma_i/r_{ij})^6\} \quad (2)$$

Each prototype of the potential function corresponds to one electronic part Pi, the symbol $r_{ij}$ denotes a distance between the center of the electronic part Pi and the center of another electronic part Pj connected with the electronic part Pi, and the symbols $\alpha_i$, $\beta_i$ and $\gamma_i$ denote parameters for the electronic part Pi.

Because it is preferred that the electronic parts Pi directly connected with the electronic part Pi through wirings be arranged close to the electronic part Pi, an attraction between the electronic part Pi and the group of electronic parts Pj is expressed by the first term to arrange each of the electronic parts Pj close to the electronic part Pi. That is, the first term (or the attraction term) of the prototype of the potential function Ei indicates a total length of a plurality of wirings directly connecting the electronic parts Pj with the electronic part Pi, and a partial potential energy indicated by the first term is decreased as the distances $r_{ij}$ are shortened.

Figure 3:
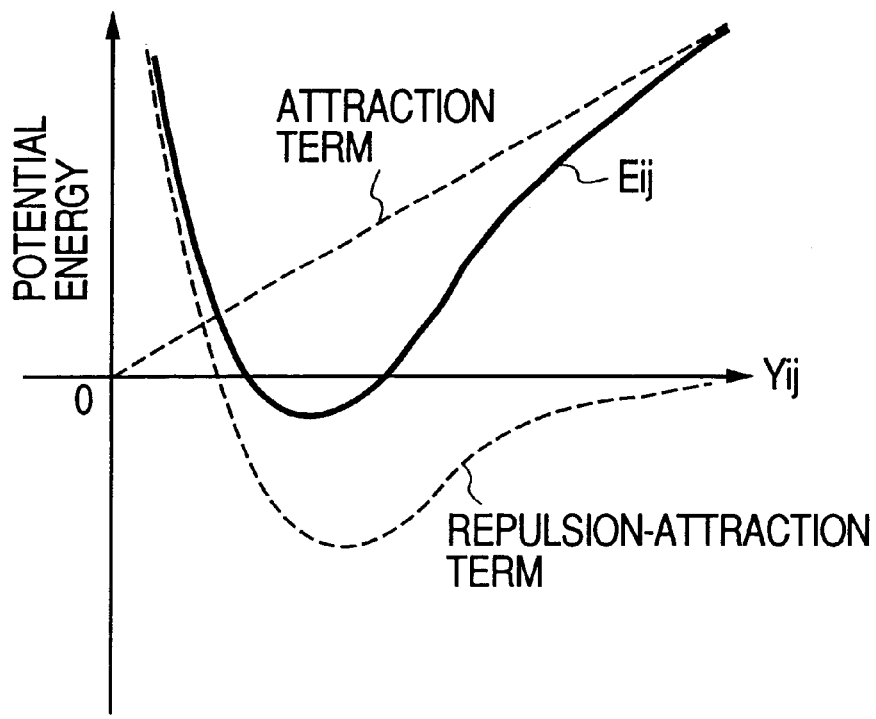
FIG. 3 shows the relationship between the distance $r_{ij}$ and a potential energy $E_{ij}$ of the electronic part $P_i$ for each electronic part $P_j$.

Also, because it is preferred that the electronic parts Pj be arranged at positions spaced at moderate distances from the electronic part Pi to prevent the electronic parts Pj overlapping with the electronic part Pi, the second term (or the repulsion-attraction term) of the prototype of the potential function Ei expresses a repulsion between the electronic part Pi and each electronic part Pj not to overlap the electronic part Pi with the electronic parts Pj and an attraction between the electronic part Pi and each electronic part Pj not to arrange the electronic parts Pj far from the electronic part Pi. The relationship between the distance $r_{ij}$ and a potential energy $E_{ij}$ of the electronic part Pi for each electronic part Pj is shown in FIG. 3.

Therefore, in cases where the distances $r_{ij}$ are set on condition that a partial potential energy indicated by the second term is minimized, the electronic parts Pj are arranged at positions spaced at moderate distances from the electronic part Pi.

Thereafter, in a step S103, when an operator inputs particular element information indicating a plurality of particular electronic parts to the receiving unit 13, one or more particular past arrangement examples respectively corresponding to one particular electronic part Pi connected with a group of other particular electronic parts Pj (or one particular electronic part Pj) are selected by the selecting unit 14 from the past arrangement examples of the storing unit 11 for each of the particular composing elements Pi of the particular element information (step S104). The particular element information is composed of pieces of particular position information indicating initial positions of the particular composing elements connected with each other, pieces of particular attribute information indicating a plurality of attributes of the particular composing elements and pieces of particular connection information indicating a direct connection relationship among the particular composing elements.

Thereafter, a parameter calculation number Nc indicating the number of parameter calculation operations is initially set to 1 in a step S105, and values of the parameters $\alpha_i$, $\beta_i$ and $\gamma_i$ depending on the parameter calculation number Nc are arbitrarily set within a prescribed changing range for each particular electronic part Pi in the setting unit 15 in one parameter calculation operation (step S106).

Thereafter, in a step S107, the attribute information and the connection information of the particular past arrangement examples corresponding to one particular electronic part Pi are analyzed in the evaluating unit 16 for each particular electronic part Pi to determine the first and second terms of the potential function Ei for each particular electronic part Pi, the parameters $\alpha_i$, $\beta_i$ and $\gamma_i$ set in the setting unit 15 are given to each potential function Ei, positions $r_{ij}$ indicated by the position information of the particular past arrangement examples are given to the corresponding potential function Ei for each particular electronic part Pi, a potential energy is obtained by solving each potential function Ei, and a past total potential energy Etot is obtained by summing up the potential energies.

Thereafter, in a step S108, it is judged by the evaluating unit 16 whether or not the past total potential energy $E_{tot}$ currently calculated is lower than a minimum value among total potential energies previously calculated.

In cases where the past total potential energy Etot currently calculated is lower than the minimum value, the past total potential energy Etot currently calculated is stored in a temporary storing area of the evaluating unit 16 as a minimum value among total potential energies previously calculated (step S109). Also, the values of the parameters $\alpha_i$, $\beta_i$ and $\gamma_i$ used for the calculation of the past total potential energy Etot are stored in the temporary storing area for each particular electronic part Pi. Thereafter, the procedure proceeds to a step S110. In contrast, in cases where the past total potential energy Etot currently calculated is equal to or greater than the minimum value, the procedure proceeds directly to the step S110.

In the step S110, the parameter calculation number Nc is incremented, and it is judged in a step Sill whether or not the parameter calculation number Nc exceeds an upper limit of 10000. In case of Nc≦10000, the steps S106 to S110 are repeated. Therefore, even though one set of parameters values $\alpha_i$, $\beta_i$ and $\gamma_i$ are arbitrarily set in the step S106 for each particular electronic part Pi while changing the parameter values each time the parameter calculation operation is performed, a particular set of values of the parameters $\alpha_i$, $\beta_i$ and $\gamma_i$ stored in the temporary storing area for each particular electronic part Pi is obtained in the step S108 on condition that the past total potential energy Etot obtained by giving the particular set of parameter values to each potential function Ei is sufficiently minimized.

Thereafter, a position changing number Np indicating the number of position changing operations is initially set to 1 in a step S112, a total energy $E_{tot}$ obtained by solving the total potential function $E_{tot}$, in which the particular set of values of the parameters $\alpha_i$, $\beta_i$ and $\gamma_i$ is given for each potential function Ei, is calculated for each set of positions (or coordinates) of the particular composing elements Pi of the particular element information while changing the set of positions according to a position changing method until the position changing number Np exceeds an upper limit of 10000 (steps S113, S114, S115), and a plurality of particular positions of the particular composing elements Pi of the particular element information are determined on condition that the total energy Etot is sufficiently minimized (step S116). The particular positions of the particular composing elements Pi indicating an optimum arrangement of the particular composing elements Pi are output. The position changing method performed in the step S112 is described in detail.

Each electronic part Pi placed in a potential field receives the attraction and repulsion from other electronic parts Pj, and the electronic parts Pi move according to the Newtonian mechanics to reduce the total potential energy Etot of the electronic parts Pi. A locus of each electronic part Pi moved in the potential field is expressed by an equation of motion, and the motion equations of the electronic parts Pi are numerically solved according to a difference calculus to obtain the loci of the electronic parts Pi.

A position (or coordinates) of each electronic part Pi at a time t is expressed by a position vector Ri(t). A Taylor expansion is performed around the time t for position vectors Ri(t±Δt) of each electronic part Pi at a time t+Δt and a time t−Δt, and the terms higher than the third order are omitted in Taylor-expanded position vectors Ri(t±Δt) because Δt is sufficiently small. Therefore, a following equation $$Ri(t\pm\Delta t)=Ri(t)\pm dR_i(t)/dt*\Delta t+\tfrac{1}{2}*d^2R_i(t)/dt^2*(\Delta t)^2$$

is obtained for each electronic part Pi. The symbol $\Delta t$ denotes a minute time, the symbol $d/dt$ denotes a differentiation by time, and the symbol $d^2/dt^2$ denotes a quadratic differentiation by time. Therefore, $$Ri(t+\Delta t)+Ri(t-\Delta t)=2*Ri(t)+d^2R_i(t)/dt^2*(\Delta t)^2$$

is obtained for each electronic part Pi. Therefore, the position $Ri(t+\Delta t)$ of the electronic part Pi at the time $t+\Delta t$ is expressed as follows.

$$Ri(t+\Delta t)=2*Ri(t)-Ri(t-\Delta t)+d^2R_i(t)/dt^2*(\Delta t)^2$$

A vector Fi of force exerting on the electronic part Pi placed in a position $Ri(t)=(x_i,y_i,z_i,t)$ of the potential field at the time t is expressed as follows.

$$Fi = m*d^2R_i(t)/dt^2$$
$$= -\nabla_i E_{tot}$$

The symbol m denotes a weight of the electronic part Pi, and the symbol $\nabla_i$ denotes a nabla $(\delta/\delta x, \delta/\delta y, \delta/\delta z)$. Therefore, the above equation is rewritten as follows.

$$Ri(t+\Delta t)=2*Ri(t)-Ri(t-\Delta t)-1/m*\nabla_i E_{tot}*(\Delta t)^2$$

Therefore, after the positions $Ri(t)$ and $Ri(t-\Delta t)$ of the electronic part Pi at the time t and the time $t-\Delta t$ are determined, the position $Ri(t+\Delta t)$ of the electronic part Pi at the time $t+\Delta t$ can be determined by differentiating the potential energy $E_{tot}$ of the electronic part Pi. In other words, because the positional vectors $Ri(0)$ of the particular electronic parts Pi are input as an initial arrangement of the particular electronic parts in the step S103 and the initial potential energies $Ei(x_i,y_i,z_i,0)$ of the particular electronic parts Pi can be calculated, a positional vector $Ri(\Delta t)$ of each particular electronic part Pi is expressed as follows.

$$Ri(\Delta t)=Ri(0)-1/m*\nabla_i E_{tot}*(\Delta t)^2$$

Here, $Ri(O)=Ri(-\Delta t)$ is assumed. Therefore, the positional vector $Ri(t)$ of each particular electronic part Pi at an arbitrary time $t=Np*\Delta t$ (Np is the position changing number expressed by a positive integer) can be determined. It is preferred that positions of the particular electronic parts Pi at the time $\Delta t$ be input to the receiving unit 13 as the positional vectors $Ri(-\Delta t)$.

When the positional vectors $Ri(Np1\Delta t)$ of the particular electronic parts Pi are determined (step S113), the value Np1 of the position changing number Np is incremented (step S114), and it is judged whether or not the position changing number Np exceeds an upper limit of 10000 (step S115). In case of $Np \leq 10000$, the step S113 is repeated to determine the positional vectors $Ri(Np1\Delta t+\Delta t)$ of the particular electronic parts Pi. Therefore, when the calculation of the positional vectors $Ri(Np\Delta t)$ is repeated while increasing the position changing number Np, a plurality of particular positions of the particular composing elements Pi are determined on condition that the total energy $E_{tot}$ is sufficiently minimized (step S116).

Accordingly, the positions of the particular composing elements Pi can be set in an optimum arrangement without extracting any knowledge required for the electronic part arrangement from a skill person. Also, because knowledge unconsciously used by a skill person is reflected on the past arrangement examples stored in the storing unit 11 as well as knowledge consciously used by the skill person, the operator can reflect the knowledge unconsciously used by a skill person on the arrangement of the particular electronic parts as well as the knowledge consciously used by the skill person.

Also, because the parameters of the total potential function $E_{tot}$ are automatically set, even though the operator has no technical knowledge about the total potential function $E_{tot}$, an optimum arrangement of the particular composing elements Pi can be obtained by inputting a prototype of the total potential function.

In this embodiment, the potential energy Ei is increased in proportion to a total length of a plurality of wirings connecting the electronic parts Pj with the electronic part Pi. However, it is applicable that the potential energy Ei be increased in proportion to the square of a total length of a plurality of wirings connecting the electronic parts Pj with the electronic part Pi. Also, because it is required that a potential energy $E_{ij}$ of the electronic part Pi for the electronic part Pj is minimized when the electronic part Pj is spaced from the electronic part Pi at a moderate distance, it is applicable that the second term be expressed by a quadratic function or the similar function.

Also, it is applicable that a term for arranging a plurality of electronic parts having shapes similar to each other at positions close to each other be added to each prototype of the potential function Ei. Also, it is applicable that a term for arranging a plurality of electronic parts operated by one or more specific electronic parts such as an electric power circuit at positions close to each other be added to each prototype of potential function Ei. In cases where a term is added to each prototype of potential function Ei, it is applicable that one or more parameters for the term be added to each prototype of potential function Ei.

Also, an allowable distance between two electronic parts not to overlap with each other is determined according to the shapes of the electronic parts. However, because one or more wirings are drawn between the electronic parts, an actual space required for each electronic part is a body space of the electronic part and a wiring space surrounding the body space. Therefore, it is preferred that an allowable distance between two electronic parts not to overlap with each other be determined according to the actual spaces of the electronic parts.

Also, the parameter values are set in random within a prescribed changing range in the setting unit 15. However, it is applicable that distances $r_{ij}$ actually set in each particular past arrangement example be given to a potential function Ei corresponding to the particular past arrangement example and values of the parameters $\alpha_i$, $\beta_i$ and $\gamma_i$ be roughly calculated to roughly minimize a potential energy obtained by solving the potential function Ei.

Also, values of the parameters $\alpha_i$, $\beta_i$ and $\gamma_i$ are set for each particular electronic part Pi. However, it is applicable that values of the parameters $\alpha_i$, $\beta_i$ and $\gamma_i$ be set for each type of particular electronic parts Pi, each group of particular electronic parts Pi having shapes similar to each other or each group of particular electronic parts Pi having the same number of connection terminals.

Also, the weight m of the electronic part Pi is a real physical mass. However, it is applicable that the weight m of the electronic part Pi be a virtual mass determined by considering the mobility of the electronic part Pi.

Also, in cases where the operator desires not to move a specific electronic part, it is preferred that the specific electronic part be maintained at its initial position.

Also, the calculation of the positional vectors Ri(NpΔt) is repeated 10000 times. However, in cases where the difference between a group of the positional vectors Ri(NpΔt) and a group of positional vectors Ri(NpΔt+Δt) is sufficiently small, it is applicable that the calculation of the positional vectors Ri(NpΔt) be stopped and the procedure proceed to the step S116.

Figure 4:
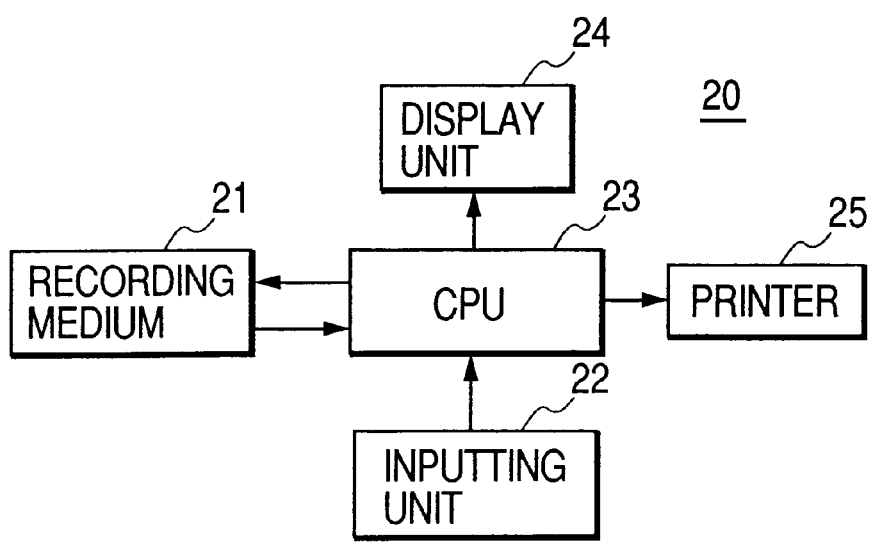
FIG. 4 is a block diagram of a computer system for performing the automatic arrangement method according to the first embodiment.

FIG. 4 is a block diagram of a computer system for performing the automatic arrangement method according to the present invention.

As shown in FIG. 4, a computer system 20 comprises: a recording medium 21 such as a floppy disk or a hard disk (HD) for recording a computer program of the automatic arrangement method shown in FIG. 2 and recording the past examples and the prototype of the total potential function;

an inputting unit 22 such as a keyboard or a mouse for receiving the particular element information;

a central processing unit (CPU) 23 for executing the computer program recorded in the recording medium 21 to perform the automatic arrangement method shown in FIG. 2 when the particular element information is received in the inputting unit 22;

a display unit 24 for displaying the particular positions of the particular composing elements CEp (or the particular electronic parts) to show an optimum arrangement of the particular composing elements; and a printer 25 for outputting the particular positions of the particular composing elements CEp (or the particular electronic parts) to show an optimum arrangement of the particular composing elements.

In the above configuration, the computer program recorded in the recording medium 21 is read out to the CPU 23, the automatic arrangement method is performed, and an optimum arrangement of the particular composing elements is shown by the display unit 24 or the printer 25. Therefore, an optimum arrangement of the particular composing elements can be automatically obtained in the computer system 20 without extracting arrangement knowledge of a skilled person.

(Second Embodiment)

In this embodiment, positions of a plurality of composing elements are set in an optimum arrangement according to the concept of a classifier system using a genetic algorithm and a reinforcement learning. Therefore, the concept of a classifier system, the concept of the genetic algorithm and the concept of the reinforcement learning are described prior to the description of a second embodiment.

A classifier system is one type of adaptive computing system proposed by John Holland. As shown in FIG. 5A, the classifier system fundamentally comprises a set of classifiers and a list of messages attached to the set of classifiers. Each classifier is composed of a condition part and an action part. In cases where the classifier system is expressed by words used in a production system, the classifier corresponds to a rule, and the message list corresponds to a working memory for temporarily storing an input condition (or an input message). Information indicating fitness (or strength) is normally attached to each classifier (or rule) of the classifier system. In the classifier system, a coded input condition (for example, "1110") is compared with each of codes (or coded messages such as "11", 0011", "01" and "**11", the symbol "*" denotes an arbitrary binary digit) of the classifiers in the condition part prepared in advance. In cases where the coded input condition agrees with the code "11**" of a particular classifier (No.1), the particular classifier (or particular rule) is activated, and the code "0011" of the action part of the particular classifier is output. Thereafter, a result of the action of the action part is evaluated. In cases where an evaluation value is enhanced more than a reference value, a fitness value is renewed. To renew the fitness value, a reinforcement learning is often used.

Also, in the classifier system, each rule (or each classifier) is generally changed according to a genetic algorithm. A classifier system using the genetic algorithm is disclosed in U.S. Pat. No. 4,881,178 and a literature (E. Kitano, "Genetic Algorithm", 1993). A learning method of the classifier system using the genetic algorithm disclosed in the above U.S.P and literature is roughly described.

The genetic algorithm is initially described. The genetic algorithm is based on a principle of the evolution of life such as selection (or selective crossbreeding), crossover and mutation, and the genetic algorithm is used as one type of learning method. In this genetic algorithm, a problem awaiting solution is expressed as a gene of an individual. In general, genes of various individuals are produced by using random numbers, and a group of individual genes is obtained. Thereafter, the expression of the genes is evaluated by using an evaluation function to obtain an evaluated value. In cases where the evaluated value is higher than a reference value, the genetic operation for the group of genes is completed. In contrast, in cases where the evaluated value is lower than a reference value, the group of genes is changed according to a process of the selection, the crossover or the mutation, and the expression of the changed genes is again evaluated. This genetic operation is repeated until the evaluated value becomes higher than the reference value. A basic mechanism of the selection (or selective crossbreeding) is that individuals with higher fitness have more offspring. In the crossover, a part of the chromosome of one individual is exchanged for a part of the chromosome of another individual. In the mutation, a part of the chromosome of one individual is changed to another one with certain probability.

A method for applying this genetic algorithm to the classifier system is classified into a Michigan approach and a Pitts approach.

In the Michigan approach, one classifier system is used, each rule of the classifier system is regarded as an individual, and the genetic operation is performed for a set of individuals. Therefore, a set of new rules are produced.

In contrast, in the Pitts approach, a plurality of classifier systems is used, each classifier system is regarded as an individual, and the genetic operation is performed for a set of individuals. Therefore, a set of classifier systems forms one group, and the set of classifier systems is evaluated. As an example, a case that the crossover is performed for a plurality of classifier systems as one process of the genetic algorithm is described. The crossover is performed between two classifier systems. That is, one or more rules (or a part of the chromosome) of one classifier system (or one individual) are exchanged for one or more rules (or a part of the chromosome) of another classifier system (or another individual). In general, because a length of each chromosome (or the number of rules) in one classifier system differs from that in another classifier system, a position of the crossover is specified for each classifier system. For example, as shown in FIG. 5B, a point of the crossover in one chromosome RS1 of one individual I1 is just after a rule R1, and a point of the crossover in one chromosome RS2 of another individual I2 is just after a rule R7. Thereafter, the crossover point of one classifier system (or the individual I1)

is aligned with that of another classifier system (or the individual I2), and one or more rules (R2, R3 and R4) of one classifier system (or the chromosome RS1) is crossed with one or more rules (R8, R9 and R10) of another classifier system (or the chromosome RS2). In this Pitts approach, because each classifier system is regarded as one individual, it is not required to evaluate each rule, but the evaluation is performed for each classifier system.

Next, the reinforcement learning is described. The reinforcement learning is performed to adjust the fitness value of each rule. The reinforcement learning is performed according to a bucket brigade algorithm or a profit sharing method.

In the bucket brigade algorithm, the fitness value of a rule is adjusted for each adoption (or activation) of the rule. An adjusting algorithm of the fitness value is as follows.

(1) The fitness value of one rule (or one classifier), which is activated because an input condition (or an input message) agrees with a message of the condition part of the rule, is reduced by a value proportional to the fitness value. For example, as shown in FIG. 5C, because an input condition "1110" agrees with a message "11**" of the condition part of the rule No.1, the rule is activated, the fitness value 100 of the rule is reduced by a value $100*C_{tax}$ proportional to a tax $C_{tax}=0.1$.

(2) A value, which is reduced from a fitness value in a current step, is added to a fitness value of a rule adopted (or activated) in a step just before the current step. For example, as shown in FIG. 5D, in cases where the rule No.1 is activated in a preceding step, a message "0011" of the action part of the rule No.1 is output, the rule No.2 and the rule No.4 are activated in a current step because a message "0011" of the condition part of the rule No.2 and a message "**11" of the condition part of the rule No.4 respectively agree with the message "0011", the fitness of the rule No.2 and the fitness of the rule No.4 are respectively reduced by a value $100*Cbid$ proportional to a bid $C_{bid}=0.1$, and the reduced value of the rule No.2 and the reduced value 10 of the rule No.4 are added to the value 90 of the fitness of the rule No.1.

(3) A result (or a reduced value of the fitness of a first rule) obtained as a result of the adoption (or activation) of a second rule is added to the fitness value of the second rule as payoff. For example, as shown in FIG. 5D, because the rule No.2 and the rule No.4 are adopted as a result of the adoption of the rule No.1, the reduced value 10 of the fitness of the rule No.2 and the reduced value 10 of the fitness of the rule No.4 are added to the fitness value of the rule No.1 as payoff.

In the above adjusting algorithm of the fitness value, though payoff occurring in a current step is given to a rule adopted (or activated) in a preceding step just before the current step, the payoff is not given to any rule adopted (or activated) in a step before the preceding step. Therefore, the learning is slowly adopted, but a calculation volume in each step is small.

In contrast, in the profit sharing method, records of rules adopted in previous steps are stored, each time payoff occurs in a current step, the payoff is given to the fitness of each rule previously adopted while the payoff is reduced by a weighted value. In this case, the weighted value is increased while the distance between the current step and the previous step is increased. Therefore, because the fitness values of all rules adopted in previous steps are adjusted each time payoff occurs in a current step, the learning is adopted at high speed, so that a calculation volume is large in cases where the payoff often occurs.

The rules of the classifier system learned according to the above genetic algorithm and the above reinforcement learning method are evaluated by using an explicit global evaluation function, and it is judged whether or not all rules of the classifier system are set to an optimum condition. Therefore, even though a plurality of classifier systems exist, each of the classifier systems is revised according to the above genetic algorithm and the above learning method, and the rules of each classifier system are evaluated according to the same evaluation function.

Figure 6:
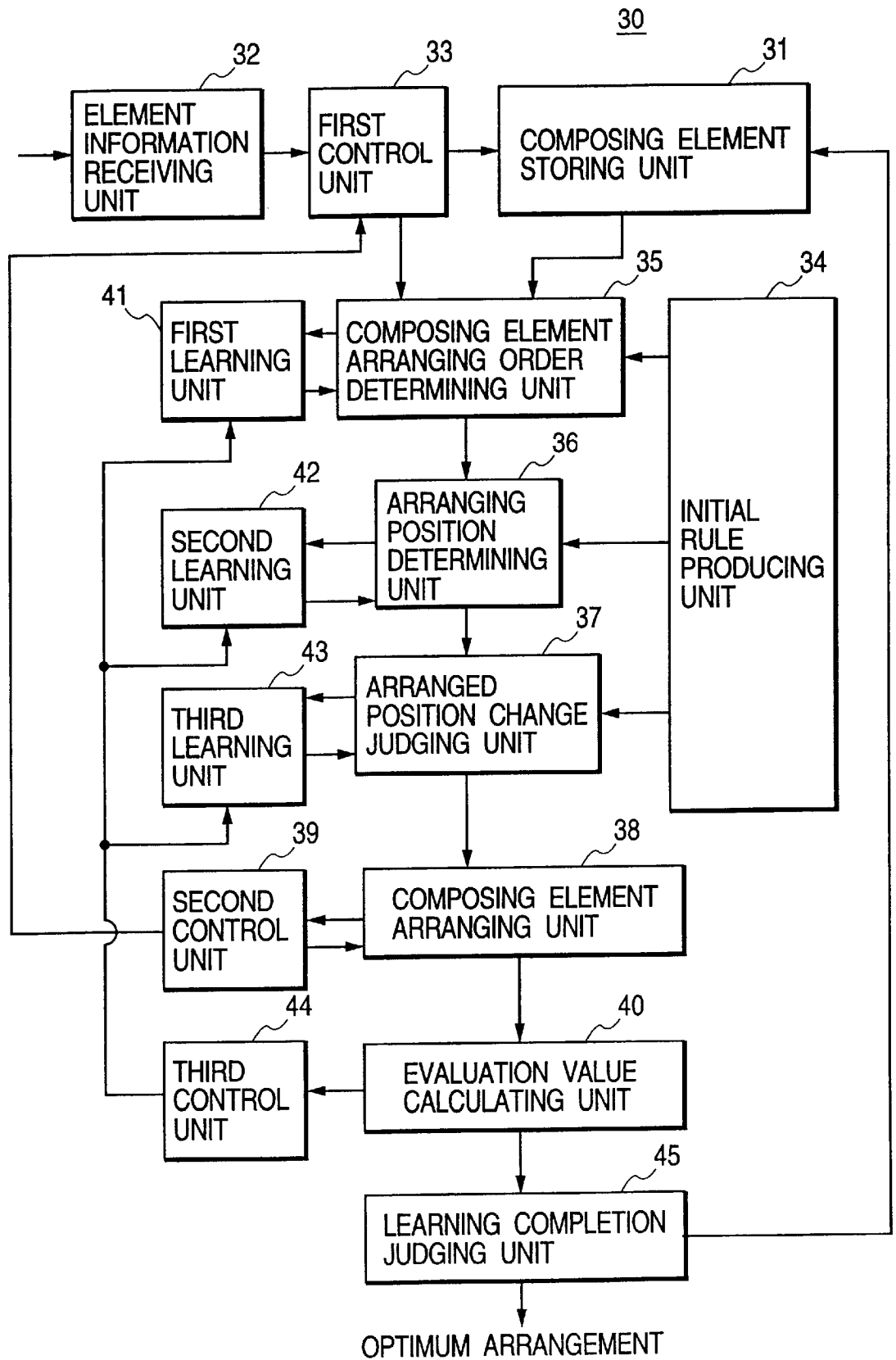
FIG. 6 is a block diagram of an automatic arrangement system according to a second embodiment of the present invention.

FIG. 6 is a block diagram of an automatic arrangement system according to a second embodiment of the present invention.

In this embodiment, the Michigan approach is adopted for the change of rules in one classifier system according to the genetic algorithm. Also, the profit sharing method is adopted for the adjustment of the fitness value of each rule in one classifier system according to the reinforcement learning method.

As shown in FIG. 6, an automatic arrangement system 30 for setting a plurality of composing elements in an optimum (or appropriate) arrangement, comprises:

a composing element storing unit 31 for storing attributes of a plurality of composing elements arranged as one set for each set, each composing element having attributes such as an area of the composing element, an element number specifying the composing element, a type of the composing element, a shape of the composing element, the number of connection pins of the composing element, element numbers specifying one or more directly-related composing elements directly connected with the composing element, and the number of connection pins connecting the composing element and each directly-related composing element;

an element information receiving unit 32 for receiving particular element information indicating a set of a plurality of particular composing elements and particular connection information indicating a direct connection of each particular composing element with other particular composing elements (or another particular composing element);

a first control unit 33 for specifying the attributes of the particular composing elements stored in the composing element storing unit 31 according to the particular element information and the particular connection information received by the receiving unit 32 and controlling the composing element storing unit 31 to output the attributes of one particular composing element in a current step for each particular composing element received by the receiving unit 32;

an initial rule producing unit 34 for producing a plurality of initial rules (called first initial rules) and initial values of the fitness of the rules corresponding to a plurality of composing elements including the particular composing elements for a first classifier system according to past arrangement examples of the composing elements and information of arrangement records of the composing elements, producing a plurality of initial rules (called second initial rules) and initial values of the fitness of the rules corresponding to the composing elements for a second classifier system according to the past arrangement examples of the composing elements and the information of arrangement records of the composing elements and producing a plurality of initial rules (called third initial rules) and initial values of the fitness of the rules corresponding to the composing elements for a third classifier system according to the past arrangement examples of the composing elements and the information of arrangement records of the composing elements, each initial rule for the first classifier system being composed of a condition rule (called a first condition rule) and an action rule (called a first action rule), each initial rule for the second classifier system being composed of a condition rule (called a second condition rule) and an action rule (called a second action rule), each initial rule for the third classifier system being composed of a condition rule (called a third condition rule) and an action rule (called a third action rule), the first condition rule of each composing element for the first classifier system and the second condition rule of each composing element for the second classifier system respectively indicating attributes of the composing element, the third condition rule of each composing element for the third classifier system indicating an arrangement condition of the composing element such as the overlapping of the composing element with another composing element, no-overlapping of the composing element with another composing element, a condition of the composing element placed outside an arrangement area or a condition of the composing element placed within the arrangement area, the first action rule of each composing element for the first classifier system indicating an arrangement priority degree of the composing element, the second action rule of each composing element for the second classifier system indicating an arranged position determining method applied for the composing element, and the third action rule of each composing element for the third classifier system indicating the judgement about the change of an arranged position of the composing element and a position changing method for preventing the overlapping of the composing element with another composing element or moving the composing element towards the center of the arrangement area;

a composing element arranging order determining unit 35, in which the first classifier system initially having the first condition rules produced in the initial rule producing unit 34 in a condition part and initially having the first action rules (indicating arrangement priority degrees) produced in the initial rule producing unit 34 in an action part is arranged, for receiving one group of attributes of one particular composing element transmitted from the composing element storing unit 31 for each particular composing element, activating one first rule of one first condition rule agreeing with the attributes of one particular composing element for each particular composing element, selecting one first action rule (indicating one arrangement priority degree) of the activated first rule for each particular composing element, selecting a specific composing element corresponding to a specific arrangement priority degree, which is the highest among the arrangement priority degrees corresponding to the particular composing elements, from the particular composing elements and outputting a group of specific attributes of the specific composing element;

an arranging position determining unit 36, in which a second classifier system initially having the second condition rules produced in the initial rule producing unit 34 in a condition part and initially having the second action rules (or the arranging position determining methods) produced in the initial rule producing unit 34 in an action part is arranged, for activating a specific second rule (corresponding to the specific composing element) of a specific second condition rule agreeing with the specific attributes of the specific composing element transmitted from the composing element arranging order determining unit 35, selecting a specific second action rule (indicating a specific arranging position determining method) of the activated specific second rule, determining a specific position (or specific coordinates) of the specific composing element according to the specific arranging position determining method and outputting the specific attributes and specific position of the specific composing element;

an arranged position change judging unit 37, in which a third classifier system initially having the third condition rules produced in the initial rule producing unit 34 in a condition part and initially having the third action rules produced in the initial rule producing unit 34 in an action part is arranged, for specifying an arrangement condition of the specific composing element (for example, an arrangement condition of the overlapping of the specific composing element with another particular composing element, an arrangement condition of no-overlapping of the specific composing element with another particular composing element, an arrangement condition of the specific composing element placed outside an arrangement area or an arrangement condition of the specific composing element placed within the arrangement area) according to the specific attributes and specific position of the specific composing element transmitted from the arranging position determining unit 36, the arrangement area and attributes and positions of particular composing elements already arranged in the arrangement area in a previous step, activating a specific third rule of a specific third condition rule agreeing with the arrangement condition of the specific composing element, selecting a specific third action rule of the activated specific third rule, and outputting the specific third action rule indicating the judgement about the change of the specific position of the specific composing element, the judgement about the change of positions of the already-arranged particular composing elements and/or a position changing method applied for the position change;

a composing element arranging unit 38 for performing the change of the specific position of the specific composing element or the change of positions of the already-arranged particular composing elements according to the position changing method transmitted from the arranged position change judging unit 37 to determine a new position of the specific composing element and new positions of the already-arranged particular composing elements in cases where the specific third action rule indicates the requirement of the position change, outputting the new position of the specific composing element and the new positions of the already-arranged particular composing elements determined in the current step to the determining unit 36 and the judging unit 37 as positions of particular composing elements already arranged in the arrangement area in the previous step;

a second control unit 39 for judging whether or not positions of all particular composing elements input to the receiving unit 32 are determined in the composing element arranging unit 38 and controlling the first control unit 33 to make the determining unit 35 select a next specific composing element, of which a specific arrangement priority degree is the highest value next to that of the specific composing element among the arrangement priority degrees, from the particular composing elements in cases where positions of all particular composing elements are not determined, the determination of the next specific composing element being performed in the units 35, 36, 37 and 38 in a next step;

an evaluation value calculating unit 40 for receiving the attributes and positions of the particular composing elements determined in the composing element arranging unit 38 in cases where it is judged by the second control unit 39 that the positions of all particular composing elements input to the receiving unit 32 are determined in the composing element arranging unit 38, detecting one or more overlapping areas among particular composing elements overlapping with each other and one or more protruding areas of one or more particular composing elements placed outside the arrangement area according to the attributes and positions of the particular composing elements, and calculating an evaluation value from the overlapping areas and the protruding areas to evaluate an arrangement of the particular composing elements;

a first learning unit 41 for performing the learning of the first classifier system of the composing element arranging order determining unit 35 to change the first rules of the first classifier system according to the genetic algorithm and to change the fitness values of the first rules of the first classifier system according to the reinforcement learning;

a second learning unit 42 for performing the learning of the second classifier system of the arranging position determining unit 36 to change the second rules of the second classifier system according to the genetic algorithm and to change the fitness values of the second rules of the second classifier system according to the reinforcement learning;

a third learning unit 43 for performing the learning of the third classifier system of the arranged position change judging unit 37 to change the third rules of the third classifier system according to the genetic algorithm and to change the fitness values of the third rules of the third classifier system according to the reinforcement learning;

a third control unit 44 for controlling the first, second and third learning units 41, 42 and 43 to perform the learning of the first, second and third classifier systems in cases where the evaluation value determined in the evaluation value calculating unit 40 is higher than the reference evaluation value and controlling the units 35 to 40 to again determine positions of all particular composing elements input to the receiving unit 32 and to again calculate an evaluation value; and a learning completion judging unit 45 for performing the judgement about the arrangement of the particular composing elements in cases where the learning of the first, second and third classifier systems is repeated prescribed times by the learning units 41, 42 and 43, judging that the positions of the particular composing elements are not set in an optimum arrangement in cases where the evaluation value calculated in the calculating unit 40 is higher than the reference evaluation value, instructing the composing element storing unit 31 to store new attributes of the composing elements arranged as one set for each set for the purpose of again performing the determination of the positions of the particular composing elements in the units 35 to 43 in cases where it is judged that the positions of the particular composing elements are not set in an optimum arrangement, judging that the positions of the particular composing elements are set in an optimum (or appropriate) arrangement in cases where the evaluation value calculated in the calculating unit 40 is equal to or lower than the reference evaluation value, and outputting the positions of the particular composing elements judged to be set in the optimum arrangement for the purpose of completing the determination of the positions of the particular composing elements in cases where it is judged that the positions of the particular composing elements are set in an optimum arrangement.

In the above configuration, a plurality of first initial rules and first initial values of the fitness of the rules corresponding to a plurality of composing elements for the first classifier system, a plurality of second initial rules and second initial values of the fitness of the rules corresponding to the composing elements for the second classifier system and a plurality of third initial rules and third initial values of the fitness of the rules corresponding to the composing elements for the third classifier system are produced by the initial rule producing unit 34 according to past arrangement examples of the composing elements and information of arrangement records of the particular composing elements.

It is applicable that the first, second and third rules for the first, second and third classifier systems be prepared by using random numbers. Also, it is applicable that the first, second and third rules be prepared in advance and be input to the producing unit 34.

Thereafter, initial rules and initial values of the fitness of the rules for the first classifier system are transmitted to the composing element arranging order determining unit 35. Therefore, a first classifier system shown in FIG. 7A is initially formed. The initial rules and initial values of the fitness of the rules for the second classifier system are transmitted to the arranging position determining unit 36. Therefore, a second classifier system shown in FIG. 7B is initially formed. The initial rules and initial values of the fitness of the rules for the third classifier system are transmitted to the arranged position change judging unit 37. Therefore, a third classifier system shown in FIG. 7B is initially formed. One condition rule of each rule for the first classifier system and one condition rule of each rule for the second classifier system respectively indicate a group of attributes of one composing element. One condition rule of each rule for the third classifier system indicates an arrangement condition of one composing element such as the overlapping of the composing element with another composing element, no-overlapping of the composing element with another composing element, a condition of the composing element placed outside an arrangement area or a condition of the composing element placed within the arrangement area. One action rule of each rule for the first classifier system indicates an arrangement priority degree of one composing element. One action rule of each rule for the second classifier system indicates an arranged position determining method applied for one composing element. One action rule of each rule for the third classifier system indicates the judgement about the change of an arranged position of one composing element and a position changing method for preventing the overlapping of one composing element with another composing element or moving one composing element towards the center of the arrangement area.

When particular element information indicating a plurality of particular composing elements and particular connection information of the particular composing elements are received in the receiving unit 32, one group of attributes of one particular composing element is transmitted from the composing element storing unit 31 to the determining unit 35 under the control of the first control unit 33 for each particular composing element.

In the determining unit 35, one or more rules of one or more condition rules for the first classifier system agreeing with one group of attributes of one particular composing element are activated for each particular composing element. Therefore, each particular composing element is specified by one or more activated first rules in the first classifier system. Thereafter, one or more first action rules of the activated first rules are specified in the first classifier system for each particular composing element. Thereafter, because each first action rule indicates a degree of the arrangement priority for one particular composing element, one specific first action rule, which indicates the arrangement priority having the highest degree, is selected from the selected first action rules, and a specific composing element corresponding to the specific first action rule is determined. Therefore, the specific composing element corresponding to the highest arrangement priority degree is selected among the particular composing elements.

In cases where there are a plurality of specific first action rules indicating the same highest arrangement priority degree, the specific first action rules are activated, and one specific first action rule is selected from among the specific first action rules at a selection probability proportional to the fitness value of the specific first action rule. That is, one specific first action rule corresponding to the highest fitness value is selected at the highest probability from among the specific first action rules, and one specific composing element corresponding to the selected specific first action rule is specified. Thereafter, one group of specific attributes of the specific composing element is output to the determining unit 36.

In the determining unit 36, a specific second rule of a specific second condition rule agreeing with the specific attributes of the specific composing element is activated, and a specific arranging position determining method indicated by a specific second action rule of the specific second rule is specified in the second classifier system. In cases where there are a plurality of specific second condition rules agreeing with the specific attributes of the specific composing element, the specific second condition rules are activated, and one specific second condition rule is selected from among the specific second condition rules at a selection probability proportional to the fitness value of the specific second condition rule. That is, one specific second condition rule corresponding to the highest fitness value is selected at the highest probability from among the specific second condition rules.

Thereafter, a specific position of the specific composing element in the arrangement area or an area surrounding the arrangement area is determined according to the specific arranging position determining method. For example, the specific composing element is arranged at the specific position to place its connection pin at the same position as a connection pin of another particular composing element already arranged in a previous step, so that the specific composing element is arranged to be directly connected with one already-arranged particular composing element. Or the specific composing element is arranged at an opening space of the arrangement area or the center of the arrangement area. Thereafter, the specific attributes and specific position of the specific composing element are output to the judging unit 37.

In the judging unit 37, an arrangement condition of the specific composing element is prepared according to the specific attributes and specific position of the specific composing element, the arrangement area and attributes and positions of particular composing elements already arranged in the arrangement area in a previous step, a specific third rule of a specific third condition rule agreeing with the arrangement condition of the specific composing element is activated, and a specific third action rule (indicating the judgement about the change of the specific position of the specific composing element, the judgement about the change of positions of one or more already-arranged particular composing elements and/or a position changing method applied for the position change) of the specific third rule is specified. Therefore, it is judged whether or not the change of the specific position of the specific composing element or the change of positions of the already-arranged particular composing elements is required. In cases where there are a plurality of specific third condition rules agreeing with the arrangement condition of the specific composing element, the specific third condition rules are activated, and one specific third condition rule is selected from among the specific third condition rules at a selection probability proportional to the fitness value of the specific third condition rule. That is, one specific third condition rule corresponding to the highest fitness value is selected at the highest probability from among the specific third condition rules. Thereafter, the specific third action rule and the specific attributes and specific position of the specific composing element are output to the arranging unit 38.

In the arranging unit 38, in cases where the specific third action rule indicates the requirement of the position change, the change of the specific position of the specific composing element or the change of positions of the already-arranged particular composing elements is performed according to the position changing method to determine a new position of the specific composing element and new positions of the already-arranged particular composing elements.

Therefore, the current step performed in the units 35 to 38 for the specific composing element having the highest arrangement priority is completed. Thereafter, in cases where the second control unit 39 judges that positions of all particular composing elements are not determined, a next specific composing element, of which a specific arrangement priority degree is the highest value next to that of the specific composing element in the current step among the arrangement priority degrees, is selected by the determining unit 35 from the particular composing elements under the control of the first control unit 33, and a next step is performed for the next specific composing element in the units 35, 36, 37 and 38 as a current step. Therefore, positions of all particular composing elements input to the receiving unit 32 are determined in the arranging unit 38 in the order of the arrangement priority for the particular composing elements.

Thereafter, in the evaluation value calculating unit 40, one or more overlapping areas among particular composing elements overlapping with each other and one or more protruding areas of one or more particular composing elements placed outside the arrangement area are detected according to the attributes and positions of the particular composing elements, and an evaluation value is calculated from the overlapping areas (or a total overlapping area) and the protruding areas (or a total protruding area). For example, a sum of the square of the total overlapping area and the square of the total protruding area is set as the evaluation value. Thereafter, the evaluation value is evaluated by the third control unit 44. In cases where the evaluation value is higher than the reference evaluation value, because the positions of the particular composing elements are not set in an optimum arrangement, the learning units 41, 42 and 43 are operated under the control of the third control unit 44.

In the learning operation of the first learning unit 41, the learning of the first classifier system of the composing element arranging order determining unit 35 is performed to change the first rules of the first classifier system according to the genetic algorithm and to adjust the fitness values of the first rules of the first classifier system according to the reinforcement learning. In the learning operation of the second learning unit 42, the learning of the second classifier system of the arranging position determining unit 36 is performed to change the second rules of the second classifier system according to the genetic algorithm and to adjust the fitness values of the second rules of the second classifier system according to the reinforcement learning. In the learning operation of the third learning unit 43, the learning of the third classifier system of the arranged position change judging unit 37 is performed to change the third rules of the third classifier system according to the genetic algorithm and to adjust the fitness values of the third rules of the third classifier system according to the reinforcement learning. In the genetic algorithm performed in the first, second and third learning units 41, 42 and 43, the group of first rules, the group of second rules and the group of third rules are respectively changed according to the processes of the selection, the crossover, the mutation and the like.

Thereafter, positions of the particular composing elements are again determined in the units 35 to 38. The learning operations of the learning units 41, 42 and .43 are repeated until the evaluation value becomes equal to or lower than the reference evaluation value. In cases where the learning operations of the learning units 41, 42 and 43 are repeated prescribed times such as 10000 times or the evaluation value becomes equal to or lower than the reference evaluation value, the evaluation value is transmitted to the learning completion judging unit 45.

In the judging unit 45, in cases where the evaluation value is higher than the reference evaluation value, because the positions of the particular composing elements are not set in an optimum arrangement, an instruction is transmitted to make the composing element storing unit 31 store new attributes of the composing elements arranged as one set for each set, and the operations of the units 35 to 43 are again performed to determine positions of the particular composing elements. In contrast, in cases where the evaluation value is equal to or lower than the reference evaluation value, because the positions of the particular composing elements are set in an optimum arrangement, the positions of the particular composing elements is output, and the determination of the positions of the particular composing elements is completed.

Accordingly, in cases where an operator desires to set positions of a plurality of particular composing elements in an optimum arrangement, the arranging order of the particular composing elements is set to the order of the arrangement priority in the first classifier system of the composing element arranging order determining unit 35, an arranging position determining method is specified for each particular composing element in the second classifier system of the arranging position determining unit 36, a position of each particular composing element is determined in the determining unit 36, the judgement about the change of the position of each particular composing element and a position changing method are obtained in the third classifier system of the arranged position change judging unit 37, and positions of one particular composing element and one or more already-arranged particular composing elements are changed according to the position changing method in the arranging unit 38 if necessary. Therefore, positions of the particular composing elements can be set in an optimum arrangement.

Also, in cases where it is judged by the third control unit 44 that the positions of the particular composing elements are not set in an optimum (or appropriate) arrangement, the rules of the first, second and third classifier systems are changed according to the genetic algorithm by the first, second and third learning units 41, 42 and 43, and the fitness values of the rules of the first, second and third classifier systems are adjusted according to the reinforcement learning by the first, second and third learning units 41, 42 and 43. Therefore, even though initial rules set in the initial rule setting unit 34 are not strictly determined to set composing elements in an optimum arrangement, positions of the particular composing elements can be reliably set in an optimum arrangement.

In this embodiment, both the genetic algorithm and the reinforcement learning are performed by each of the first, second and third learning units 41, 42 and 43. However, it is applicable that the genetic algorithm or the reinforcement learning be performed by each of the first, second and third learning units 41, 42 and 43.

Also, it is applicable that the genetic algorithm be performed for the rules of each classifier system in the order of decreasing values of the fitness. Also, it is applicable that the reinforcement learning be performed for the activated rules of each classifier system.

Next, an example that a plurality of electronic parts (equivalent to composing elements) are automatically arranged on a PCB according to the automatic arrangement method by using the automatic arrangement system 30 is described with reference to FIGS. 8, 9 and 10.

Figure 8:
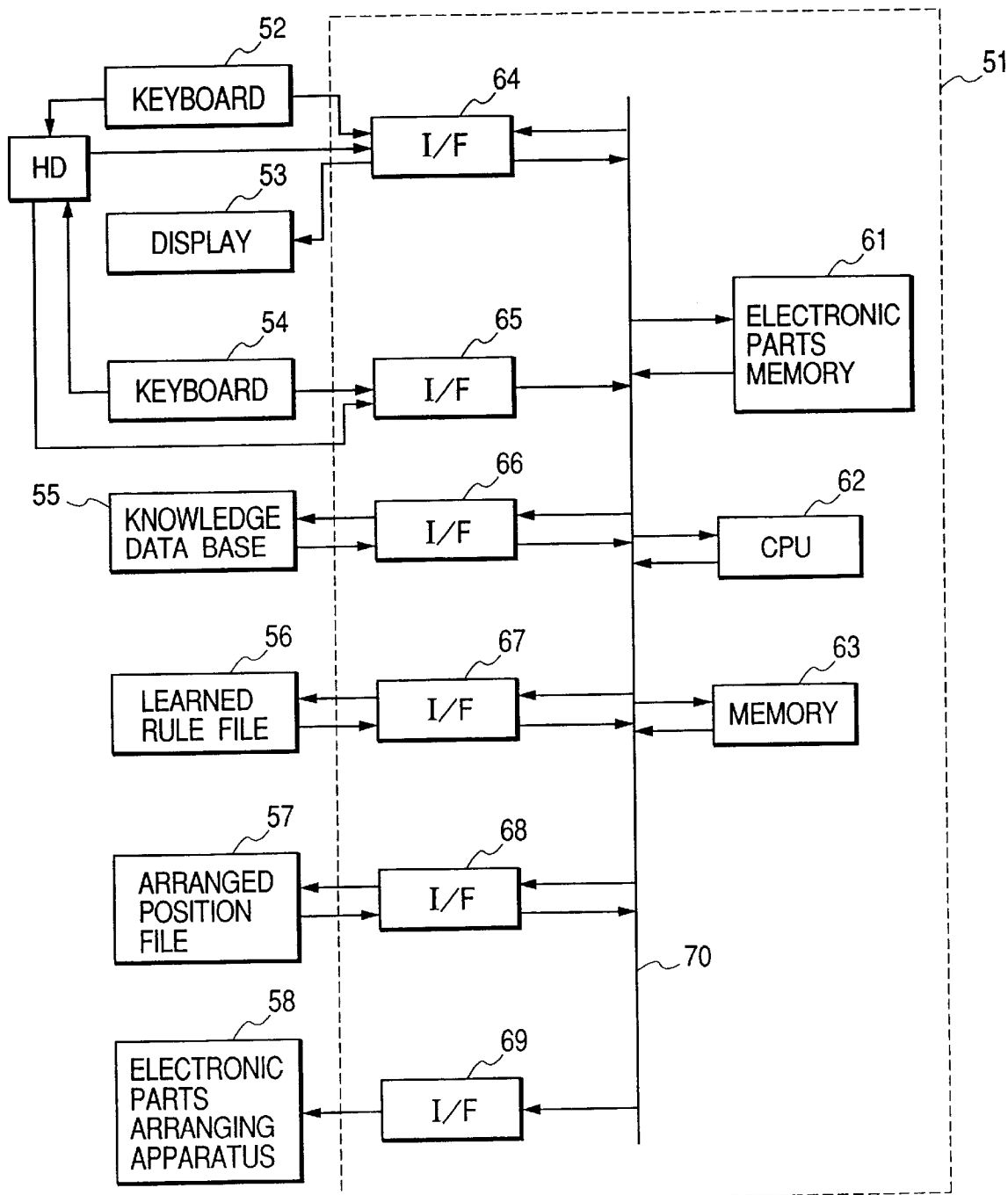
FIG. 8 is a block diagram of a computer system for performing an automatic arrangement method according to the second embodiment.

FIG. 8 is a block diagram of a computer system for performing the automatic arrangement method according to the second embodiment.

As shown in FIG. 8, a computer system 50 comprises
a computer 51 for executing an automatic arrangement program;
a keyboard 52, functioning as the element information receiving unit 32, for receiving particular element information input by a user or read out from a hard disk (HD);
a display 53 for displaying positions of particular electronic parts set in an optimum arrangement;
a keyboard 54 for receiving initial rules input by an operator or read out from the hard disk;
a knowledge data base 55 for storing coded information indicating arrangement rules and fitness of the rules obtained according to technical knowledge of skilled persons for a large number of electronic parts ;
a learned rule file 56 for storing rules changed according to the genetic algorithm and fitness values of the rules adjusted according to the reinforcement learning;
an arranged position file 57 for storing information indicating arranged positions of the particular electronic parts set in an optimum arrangement; and an electronic parts arranging apparatus 58 for actually arranging particular electronic parts on a PCB according to the arranged positions of the particular electronic parts set in an optimum arrangement.

The computer 51 comprises:

an electronic parts memory 61, functioning as the composing element storing unit 31, for storing attributes of a plurality of particular electronic parts input through the keyboard 52;

a central processing unit (CPU) 62, functioning as the units 33 to 45, for setting positions of a plurality of particular electronic parts input to the keyboard 52 in an optimum arrangement by executing the automatic arrangement program according to the initial rules input to the keyboard 54, the coded information stored in the knowledge data base 55 and the attributes of the particular electronic parts stored in the electronic parts memory 61;

a memory 63 for storing the automatic arrangement program and storing rules changed according to the genetic algorithm and fitness of rules adjusted according to the reinforcement learning;

a plurality of interfaces (I/F) 64 to 69 for connecting the keyboards 52 and 54, the display 53, the data base 55, the files 56 and 57 and the apparatus 58 with the computer 51; and a bus 70 for transmitting information and data.

In the above configuration of the computer system 50, an automatic arrangement of a plurality of electronic parts is described with reference to FIG. 9.

FIG. 9 shows a flow chart of an automatic arrangement of a plurality of electronic parts on a PCB according to the automatic arrangement method.

As shown in FIG. 9, in a step S201, attributes of each electronic part such as an area of the electronic part, a type of electronic part, the number of connection pins of the electronic part and the number of already-arranged electronic parts directly connected with the electronic part, the number of already-arranged electronic parts and an opening area are input to the keyboard 54 by an operator as first and second condition rules of the first classifier system, and arrangement priority degrees of the electronic parts determined according to past arrangement examples of the particular composing elements and information of arrangement records of the particular composing elements are input to the keyboard 54 as first action rules of the first classifier system. Also, third condition rules, second action rules, third action rules and fitness of the rules are input to the keyboard 54, so that the rules and fitness of the first, second and third classifier systems are initially set in the CPU 62. As shown in FIG. 10A, these rules are coded.

In this embodiment, the fitness of the rules are initially set to predetermined values. However, in cases where the operator recognizes the importance degree of each rule, it is applicable that the fitness of each rule be initially set according to the importance degree of the rule. Also, it is applicable that coded information indicating arrangement rules and fitness of the rules obtained according to technical knowledge of skilled persons for electronic parts be read out from the knowledge data base 55 and be set as the rules and fitness of the first, second and third classifier systems.

Thereafter, in a step S202, attributes of one particular electronic part such as an area of the particular electronic part, a part number identifying the particular electronic part, a type of particular electronic part, a shape of the particular electronic part, the number of connection pins of the particular electronic part, part numbers of directly-related particular electronic parts directly connected with the particular electronic part and the like are input to the keyboard 52 or read out from a hard disk for each particular electronic part, and the attributes of the particular electronic parts are stored in the electronic parts memory 61.

In a step S203, a specific electronic part corresponding to the highest arrangement priority is selected from the particular electronic parts in the first classifier system.

In a step S204, an arranging position determining method for the specific electronic part is specified in the second classifier system, and a specific position of the specific electronic part is determined according to the determining method in an arrangement area or an area surrounding the arrangement area.

In a step S205, the judgement about the change of the specific position of the specific composing element and the judgement about the change of one position of one particular composing element already arranged are performed.

In a step S206, in cases where it is judged that the change of the specific position of the specific composing element or the change of one position of one particular composing element already arranged is required, the specific position of the specific composing element or one position of one particular composing element already arranged are changed to a new position according to a position changing method. For example, to prevent the overlapping of the specific composing element or the already-arranged particular composing element with another already-arranged particular composing element, the specific composing element or the already-arranged particular composing element is moved to increase a distance between the specific composing element or the already-arranged particular composing element and another already-arranged particular composing element. Also, to place the specific composing element placed outside the arrangement area within the arrangement area, the specific composing element is moved towards the center of the arrangement area.

In a step S207, it is judged whether or not positions of all particular electronic parts are set. In cases where positions of all particular electronic parts are not set, a specific electronic part is newly determined in the step S203, and the following steps S204 to S207 are repeated.

In a step S208, in cases where positions of all particular electronic parts are set, a sum of the square of a total overlapping area and the square of a total protruding area is set as an evaluation value. In this embodiment, the sum of the squares is set as the evaluation value. However, it is applicable that a sum of a total overlapping area and a total protruding area be set as an evaluation value.

In a step S209, it is judged according to the valuation value whether or not the positions of the particular composing elements are set in an optimum arrangement. In cases where the evaluation value is higher than a reference evaluation value, because the positions of the particular electronic parts are not set in an optimum arrangement, the procedure proceeds to a step S210.

In the step S210, the rules of the first, second and third classifier systems are changed according to the genetic algorithm, and the fitness values of the rules are adjusted according to the reinforcement learning, and the changed rules and the adjusted fitness values are stored in the memory 63. For example, as shown in FIG. 10B, in cases where the first rule R11 "13112210" defined as the combination of the first condition rule Rc11 "1311221" and the first action rule Ra11 "0" and the first rule R14 "15111*21" defined as the combination of the first condition rule Rc14

"15111*2" and the first action rule Ra14 "1" are changed by performing the crossover for the first rules R11 and R14 with each other, a crossing position is determined for each of the first rules R11 and R14, and the first rules R11 and R14 are crossed with each other to produce a changed first rule R11 "13111*21" and a changed first rule R14 "15112210". Therefore, a changed first condition rule Rc11 "13111*2", a changed first action rule Ra11 "1", a changed first condition rule Rc14 "1511221", and a changed first action rule Ra14 "0" are obtained.

Thereafter, the steps S202 to S209 are again performed. Therefore, the rules and the fitness values of the rules are gradually changed and adjusted in each classifier system each time the step S210 is performed, and it is finally judged in the step S209 that the evaluation value is equal to or lower than the reference evaluation value. That is, it is judged that the positions of the particular electronic parts are set in an optimum arrangement, and the arrangement of the particular electronic parts is completed.

Thereafter, the changed rules and the adjusted fitness values of the classifier systems are transmitted to the learned rule file 56, and the positions of the particular electronic parts are transmitted to the arranged position file 57 and the electronic parts arranging apparatus 58. Thereafter, the particular electronic parts are actually arranged on a PCB in the arranging apparatus 58 according to the arranged positions of the particular electronic parts set in an optimum arrangement.

Accordingly, the positions of the particular electronic parts can be automatically set in an optimum (or appropriate) arrangement without extracting knowledge of element arrangement from a skilled person.

Having illustrated and described the principles of the present invention in a preferred embodiment thereof, it should be readily apparent to those skilled in the art that the invention can be modified in arrangement and detail without departing from such principles. We claim all modifications coming within the scope of the accompanying claims.

What is claimed is:

1. A method for automatically arranging a plurality of particular electric parts of an electric device at an optimum arrangement on a printed circuit board, by using a plurality of past examples respectively indicating a past arrangement of a set of electric parts of the electric device, each past example of electric parts being composed of position information indicating positions of the set of electric parts and attribute information indicating attributes of the set of electric parts, also by using information indicative of a potential function including one or more parameters for indicating a potential energy of each electric part of the set of electric parts, the plurality of past examples and the information indicative of the potential function being stored in a storing unit, the method comprising the steps of:

selecting a plurality of particular past examples corresponding to the plurality of particular electric parts from the past examples stored in the storing unit;

automatically determining values of the one or more parameters of the potential function according to the particular past examples for each particular electric part;

differentiating each of the potential functions to obtain a force exerted on each particular electric part to be arranged on the printed circuit board;

changing, under calculation, a position of each particular electric part to be arranged on the printed circuit board according to the force so as to decrease a total potential energy obtained by summing up the potential energies of the particular electric parts, each potential energy of one particular electric part being obtained by determining a position of the particular electric part in one potential function;

determining a particular arrangement of the particular electric parts placed at the changed positions as the optimum arrangement; and outputting information indicating the determined optimum arrangement through an outputting device.

2. An automatic arrangement method according to claim 1 in which the step of automatically determining values of one or more parameters includes the step of:

determining the values of the parameters for each particular electric part on condition that a sum of a plurality of potential energies obtained by setting positions of the particular electric parts indicated by the particular past examples to the potential functions is minimized.

3. An automatic arrangement method according to claim 1 in which the step of automatically determining values of one or more parameters includes the step of:

equalizing the values of the parameters for a first particular electric part with those for a second particular electric part in cases where one attribute of the first particular electric part is the same as that of the second particular electric part.

4. An automatic arrangement method according to claim 1 in which the step of automatically determining values of one or more parameters includes the step of:

equalizing the values of the parameters for a first particular electric part with those for a second particular electric part in cases where one attribute of the first particular electric part is similar to that of the second particular electric part.

5. A method for automatically arranging a plurality of particular electric parts of an electric device at an optimum arrangement on a printed circuit board, by using a plurality of past examples respectively indicating a past arrangement of a set of electric parts of the electronic device, each past example being composed of past position information indicating past positions of the set of electric parts, past attribute information indicating attributes of the set of electric parts and past connection information indicating a direct connection of each electric part with other electric parts or another electric part, also by using a prototype of a total potential function indicating a total potential energy of the set of electric parts, the plurality of past examples and the information indicative of the potential function being stored in a storing unit, the method comprising the steps of:

inputting particular part information of the plurality of particular electric parts, the particular part information including particular attribute information, indicating attributes of the particular electric parts, and particular connection information, indicating a direct connection of each particular electric part with at least one other particular electric part;

selecting a plurality of particular past examples corresponding to the particular electric parts from the past examples stored in the storing unit, the particular past examples including particular past position information of the particular electric parts, particular past attribute information of the particular electric parts and particular past connection information of the particular electric parts;

producing a total past potential function corresponding to the particular electric parts from the prototype of the total potential function according to the particular past attribute information and the particular past connection information;

setting values of one or more parameters included in the total past potential function as a set of parameter values;

calculating a total past potential energy of the particular electric parts from the total past potential function by giving both of:

one set of parameter values to the total past potential function to determine an equation of the total past potential function; and particular past positions of the particular electric parts indicated by the particular past position information to the equation of the total past potential function to solve the equation each time the set of parameter values is set while changing the parameter values;

determining a particular set of parameter values on condition that the total past potential energy calculated according to the particular set of parameter values is minimized;

producing the total potential function corresponding to the particular electric parts from the prototype of the total potential function according to the particular attribute information and the particular connection information;

giving the particular set of parameter values to the total potential function to determine a particular equation of the total potential function;

determining a particular set of positions of the particular electric parts on condition that a particular total potential energy of the particular obtained from the particular equation of the total potential function is minimized by giving the particular set of positions to the particular equation of the total potential function;

adopting a particular arrangement of the particular electric parts determined by the particular set of positions of the particular electric parts as the optimum arrangement of the particular electric parts; and outputting the adopted optimum arrangement through an outputting device.

6. An automatic arrangement method according to claim 5 in which the step of setting values of one or more parameters comprises the step of:

calculating the values of the parameters on condition that a past potential energy obtained by solving the total past potential function is minimized by giving the values of the parameters and past positions of the particular electric parts indicated by the particular past position information of the particular past examples to the total past potential function.

7. An automatic arrangement method according to claim 6 in which the step of producing a total past potential function comprises the steps of:

producing a past potential function corresponding to each particular electric part from the prototype of the total potential function according to the particular past attribute information and the particular past connection information of the particular past examples, a potential energy of each particular electric part being obtained by solving the past potential function corresponding to the particular electric part; and summing up the past potential functions corresponding to the particular electric parts to obtain the total past potential function, and the step of calculating the values of the parameters comprises the step of:

calculating values of one or more parameters of each past potential function on condition that a sum of a plurality of past potential energies obtained by solving the past potential functions is minimized by giving the values of the parameters and past positions of the particular electric parts indicated by the particular past position information of the particular past examples to each past potential function.

8. An automatic arrangement method according to claim 5 in which the step of producing the total potential function comprises the steps of:

producing a potential function corresponding to each particular electric part from the prototype of the total potential function according to the particular attribute information and the particular connection information of the part information, a potential energy of each particular electric part being obtained by solving the potential function corresponding to the particular electric part; and summing up the potential functions corresponding to the particular electric parts to obtain the total potential function, and the step of setting values of one or more parameters comprises the steps of:

classifying the potential functions into a plurality of groups of potential functions, a plurality of particular electric parts corresponding to a plurality of potential functions in the same group having the same attribute indicated by the particular attribute information of the particular electric parts; and setting values of one or more parameters used in each potential function on condition that the parameter values of one potential function of one group are the same as those of another potential function of the same group.

9. An automatic arrangement method according to claim 5 in which the step of producing the total potential function comprises the steps of:

producing a potential function corresponding to each particular electric part from the prototype of the total potential function according to the particular attribute information and the particular connection information of the part information, a potential energy of each particular electric part being obtained by solving the potential function corresponding to the particular electric part; and summing up the potential functions corresponding to the particular electric parts to obtain the total potential function, and the step of setting values of one or more parameters comprises the steps of:

classifying the potential functions into a plurality of groups of potential functions, a plurality of particular electric parts corresponding to a plurality of potential functions in the same group having a plurality of attributes indicated by the particular attribute information of the particular electric parts, the attributes of the potential functions being similar to each other; and setting values of one or more parameters used in each potential function on condition that the parameter values of one potential function of one group are the same as those of another potential function of the same group.

10. An automatic arrangement method according to claim 5 in which the step of determining a particular set of positions comprises the steps of:

setting a position Ri(t−Δt) of each particular electric part at a time t−Δt, the symbol Δt denoting a minute time;

setting a position Ri(t) of each particular electric part at a time t;

giving the positions Ri(t) of the particular electric parts to the particular equation of the total potential function;

solving the particular equation of the total potential function to calculate a potential energy Ei(t) of each particular electric part at a time t;

calculating a position Ri(t+Δt) of each particular electric part at a time t+Δt according to an equation $$Ri(t+\Delta t)=2*Ri(t)-Ri(t-\Delta t)-1/m*\Box_i E_{tot}*(\Delta t)^2,$$

the symbol $\Box_i$ denoting a nabla, and the symbol $E_{tot}$ denoting a total energy of the particular electric parts; and repeating the calculation of the positions of the particular electric parts to obtain the particular set of positions Ri(T) at a particular time T, a value of $\Box_i E_{tot}$ being almost zero.

11. An automatic arrangement method according to claim 10 in which the particular part information includes initial position information indicating a plurality of initial positions Ri(0), Ri(−Δt) of the particular electric parts.

12. An automatic arrangement method according to claim 5 in which the step of using a prototype of a total potential function comprises the steps of:

adding an attraction term to the prototype of the total potential function to express an attraction between one electric part E1 and the other electric parts E2 for each electric part E1, the total potential energy of the electric parts indicated by the attraction term decreasing as each of the electric parts E2 becomes close to the electric part E1; and adding a repulsion-attraction term to the prototype of the total potential function to express a repulsion between each electric part E1 and the other electric parts E2 not to overlap the electric part E1 with the electric parts E2 and an attraction between each electric part E1 and the other electric parts E2 not to arrange the electric parts E2 far from the electric part E1, the total potential energy of the electric parts indicated by the repulsion-attraction term decreasing as the electric parts E2 approach positions spaced at moderate distances from the electric part E1.

13. An automatic arrangement system for automatically arranging a plurality of particular electric parts of an electric device at an optimum arrangement on a printed circuit board, the system comprising:

past example storing means for storing a plurality of past examples respectively indicating a past arrangement of a set of electric parts of the electric device, each past example being composed of past position information indicating past positions of the set of electric parts, past attribute information indicating attributes of the set of electric parts and past connection information indicating a direct connection of each electric part with other electric parts or another electric part;

total potential function storing means for storing a prototype of a total potential function indicating a total potential energy of the set of electric parts;

element information receiving means for receiving particular part information of the plurality of particular electric parts, the particular part information being composed of particular attribute information indicating attributes of the particular electric parts and particular connection information indicating a direct connection of each particular electric part with other particular electric parts or another particular electric part;

past example selecting means for selecting a plurality of particular past examples corresponding to the particular electric parts from the past examples, the particular past examples being composed of particular past position information of the particular electric parts, particular past attribute information of the particular electric parts and particular past connection information of the particular electric parts;

parameter value determining means for producing a total past potential function corresponding to the particular electric parts from the prototype of the total potential function according to the particular past attribute information and the particular past connection information of the particular past examples, setting values of one or more parameters included in the total past potential function as a set of parameter values each time the parameter values are changed, determining an equation of the total past potential function by giving one set of parameter values to the total past potential function, calculating a total past potential energy of the particular electric parts from the equation of the total past potential function by giving particular past positions of the particular electric parts indicated by the particular past position information to the equation of the total past potential function each time the parameter values are changed, and determining a particular set of parameter values on condition that the total past potential energy calculated according to the particular set of parameter values is minimized; and optimum arrangement determining means for producing the total potential function corresponding to the particular electric parts from the prototype of the total potential function according to the particular attribute information and the particular connection information of the particular part information, giving the particular set of parameter values to the total potential function to determine a particular equation of the total potential function, determining a particular set of positions of the particular electric parts on condition that a particular total potential energy of the particular electric parts obtained from the particular equation of the total potential function is minimized by giving the particular set of positions to the particular equation of the total potential function, adopting a particular arrangement of the particular electric parts determined by the particular set of positions of the particular electric parts as the optimum arrangement of the particular electric parts, and outputting the adopted optimum arrangement through an outputting device.

14. An automatic arrangement system according to claim 13 in which the parameter value determining means includes:

parameter value setting means for calculating the values of the parameters on condition that a past potential energy obtained by solving the total past potential function is minimized by giving the values of the parameters and past positions of the particular electric parts indicated by the particular past position information of the particular past examples to the total past potential function.

15. An automatic arrangement system according to claim 13 in which the parameter value determining means includes:

parameter value setting means for producing a past potential function corresponding to each particular electric part from the prototype of the total potential function according to the particular past attribute information and the particular past connection information of the particular past examples and setting values of one or more parameters used in one past potential function for each particular electric part, a particular set of parameter values being determined by the parameter value determining means for each particular electric part on condition that a sum of a plurality of past potential energies obtained by solving the past potential functions is minimized in cases where the particular set of parameter values and past positions of the particular electric parts indicated by the particular past position information of the particular past examples are given to each past potential function.

16. An automatic arrangement system according to claim 13 in which the prototype of the total potential function stored in the total potential function storing means has an attraction term and a repulsion-attraction term, an attraction between one electric part E1 and the other electric parts E2 being expressed by the attraction term for each electric part E1, the total potential energy of the electric parts indicated by the attraction term decreasing as each of the electric parts E2 becomes close to the electric part E1, a repulsion between each electric part E1 and the other electric parts E2 not to overlap the electric part E1 with the electric parts E2 and an attraction between each electric part E1 and the other electric parts E2 not to arrange the electric parts E2 far from the electric part E1 being expressed by the repulsion-attraction term, and the total potential energy of the electric parts indicated by the repulsion-attraction term decreasing as the electric parts E2 approach positions spaced at moderate distances from the electric part E1.

17. A recording medium for recording a method for controlling a computer to implement a sequence of steps of a software program for automatically arranging a plurality of electric parts of an electric device in an optimum arrangement on a printed circuit board, the sequence of steps comprising:

automatically determining values of one or more parameters included in a potential function according to a past arrangement example for each electric part, the parameters indicating a potential energy of each electric part to be arranged on the printed circuit board;

differentiating each potential function to obtain a force exerted on each electric part to be arranged on the printed circuit board;

changing a position of each electric part to be arranged on the printed circuit board according to the force so as to decrease a total potential energy of the electric parts; and determining a particular arrangement of the electric parts placed at the changed positions as the optimum arrangement.

18. A method for automatically arranging a plurality of electric parts providing circuitry of an electric device at an optimum arrangement on a printed circuit board, comprising the steps of:

determining an arranging order of the plurality of electric parts in a first classifier system according to attributes of the electric parts and one or more connection conditions among the electric parts;

determining an arranging position determining method for each electric part in the arranging order in a second classifier system according to the attributes and the connection conditions;

determining an arranged position of each electric part in an arrangement area or an area surrounding the arrangement area on the printed circuit board according to the arranging position determining method determined for each electric part in the arranging order;

judging in a third classifier system whether or not the change of the arranged position of each electric part is required according to the attributes and the arranged positions of the electric parts and the connection conditions among the electric parts in the arranging order;

detecting a position changing method for one electric part in the third classifier system in cases where it is judged that the change of the arranged position of each electric part is required;

changing the arranged position of one electric part according to the position changing method for each electric part, in cases where it is judged that the change of the arranged position is required, to determine the arranged positions of the electric parts as the optimum arrangement in the arrangement area; and outputting information indicting the determined optimum arrangement through an outputting device.

19. An automatic arrangement method according to claim 18 in which the step of determining an arranging order includes the steps of:

setting one or more attributes in a condition part of the first classifier system as a first condition rule of a first rule for each first rule;

setting an arrangement priority degree in an action part of the first classifier system as a first action rule of one first rule for each first rule;

activating one first rule corresponding to one first condition rule, in which the attributes agreeing with those of one electric part are set, for each electric part;

detecting one arrangement priority degree set in the first action rule of the activated first rule for each electric part; and determining the arranging order of the electric parts according to the arrangement priority degrees of the electric parts.

20. An automatic arrangement method according to claim 19 in which the step of determining an arranging order further includes the step of:

changing each of the first rules respectively composed of one first condition rule and one first action rule in the first classifier system according to a genetic algorithm.

21. An automatic arrangement method according to claim 19 in which the step of determining an arranging order further includes the steps of:

producing an initial condition rule and an initial action rule of each first rule according to past arrangement examples of the electric parts;

setting the initial condition rule as one first condition rule of one first rule for each first rule;

setting the initial action rule as one first action rule of one first rule for each first rule; and changing each of the first rules in the first classifier system according to a genetic algorithm.

22. An automatic arrangement method according to claim 18 in which the step of determining an arranging position determining method includes the steps of:

setting one or more attributes in a condition part of the second classifier system as a second condition rule of a second rule for each second rule;

setting one arranging position determining method in an action part of the second classifier system as a second action rule of one second rule for each second rule;

activating one second rule corresponding to one second condition rule, in which the attributes agreeing with those of one electric part are set, for each electric part; and detecting one arranging position determining method set in the second action rule of the activated second rule for each electric part.

23. An automatic arrangement method according to claim 22 in which the step of determining an arranging position determining method further includes the step of:

changing each of the second rules respectively composed of one second condition rule and one second action rule in the second classifier system according to a genetic algorithm.

24. An automatic arrangement method according to claim 22 in which the step of determining an arranging position determining method further includes the steps of:

producing an initial condition rule and an initial action rule of each second rule according to past arrangement examples of the electric parts;

setting the initial condition rule as one second condition rule of one second rule for each second rule;

setting the initial action rule as one second action rule of one second rule for each second rule; and changing each of the second rules in the second classifier system according to a genetic algorithm.

25. An automatic arrangement method according to claim 18 in which the step of judging in a third classifier system includes the steps of:

setting an arrangement condition in a condition part of the third classifier system as a third condition rule of a third rule for each third rule;

setting one judgement about a position change and one position changing method in an action part of the third classifier system as a third action rule of one third rule for each third rule;

preparing a particular arrangement condition of one electric part according to the attributes and arranged position of the electric part and the arrangement area for each electric part;

activating one third rule corresponding to one third condition rule, in which the arrangement condition agreeing with one particular arrangement condition of one electric part is set, for each electric part; and detecting one judgement about a position change and one position changing method set in the third action rule of the activated third rule for each electric part.

26. An automatic arrangement method according to claim 25 in which the step of judging in a third classifier system further includes the step of:

changing each of the third rules respectively composed of one third condition rule and one third action rule in the third classifier system according to a genetic algorithm.

27. An automatic arrangement method according to claim 25 in which the step of judging in a third classifier system further includes the steps of:

producing an initial condition rule and an initial action rule of each third rule according to past arrangement examples of the electric parts;

setting the initial condition rule as one third condition rule of one third rule for each third rule;

setting the initial action rule as one third action rule of one third rule for each third rule; and changing each of the third rules in the third classifier system according to a genetic algorithm.

28. An automatic arrangement method according to claim 18 in which the step of determining an arranging order includes the steps of:

setting one or more attributes in a condition part of the first classifier system as a first condition rule of a first rule for each first rule;

setting an arrangement priority degree in an action part of the first classifier system as a first action rule of one first rule for each first rule;

setting a fitness value to each first rule of the first classifier system;

activating one or more first rules corresponding to one or more first condition rules, in which the attributes agreeing with those of one electric part are set, for each electric part;

selecting a particular first rule from the activated first rules at a selection probability proportional to the fitness value of the particular first rule for each electric part;

detecting one arrangement priority degree set in the first action rule of the particular first rule for each electric part; and determining the arranging order of the electric parts according to the arrangement priority degrees of the electric parts.

29. An automatic arrangement method according to claim 28 in which the step of determining an arranging order further includes the step of:

adjusting each of the fitness values set to the first rules in the first classifier system according to a reinforcement learning.

30. An automatic arrangement method according to claim 28 in which the step of determining an arranging order includes the steps of:

producing an initial fitness value of each first rule according to past arrangement examples of the electric parts;

setting the initial fitness value as one fitness value of one first rule for each first rule; and adjusting each of the fitness values in the first classifier system according to a reinforcement learning.

31. An automatic arrangement method according to claim 28 in which the step of determining an arranging order further includes the steps of:

changing each of the first rules respectively composed of one first condition rule and one first action rule in the first classifier system according to a genetic algorithm; and adjusting each of the fitness values set to the first rules in the first classifier system according to a reinforcement learning.

32. An automatic arrangement method according to claim 18 in which the step of determining an arranging position determining method includes the steps of:

setting one or more attributes in a condition part of the second classifier system as a second condition rule of a second rule for each second rule;

setting one arranging position determining method in an action part of the second classifier system as a second action rule of one second rule for each second rule;

setting a fitness value to each second rule of the second classifier system;

activating one or more second rules corresponding to one or more second condition rules, in which the attributes agreeing with those of one electric part are set, for each electric part;

selecting a particular second rule from the activated second rules at a selection probability proportional to the fitness value of the particular second rule for each electric part; and detecting one arranging position determining method set in the second action rule of the particular second rule for each electric part.

33. An automatic arrangement method according to claim 32 in which the step of determining an arranging position determining method further includes the steps of:

producing an initial fitness value of each second rule according to past arrangement examples of the electric parts;

setting the initial fitness value as one fitness value of one second rule for each second rule; and adjusting each of the fitness values in the second classifier system according to a reinforcement learning.

34. An automatic arrangement method according to claim 32 in which the step of determining an arranging position determining method further includes the step of:

adjusting each of the fitness values set to the second rules in the second classifier system according to a reinforcement learning.

35. An automatic arrangement method according to claim 32 in which the step of determining an arranging position determining method further includes the steps of:

changing each of the second rules respectively composed of one second condition rule and one second action rule in the second classifier system according to a genetic algorithm; and adjusting each of the fitness values set to the second rules in the second classifier system according to a reinforcement learning.

36. An automatic arrangement method according to claim 18 in which the step of judging in a third classifier system includes the steps of:

setting an arrangement condition in a condition part of the third classifier system as a third condition rule of a third rule for each third rule;

setting one judgement about a position change and one position changing method in an action part of the third classifier system as a third action rule of one third rule for each third rule;

setting a fitness value to each third rule of the third classifier system;

preparing a particular arrangement condition of one electric part according to the attributes and arranged position of the electric part and the arrangement area for each electric part;

activating one or more third rules corresponding to one or more third condition rules, in which the arrangement condition agreeing with one particular arrangement condition of one electric part is set, for each electric part;

selecting a particular third rule from the activated third rules at a selection probability proportional to the fitness value of the particular third rule for each electric part; and detecting one judgement about a position change and one position changing method set in the third action rule of the particular third rule for each electric part.

37. An automatic arrangement method according to claim 36 in which the step of judging in a third classifier system includes the steps of:

producing an initial fitness value of each third rule according to past arrangement examples of the electric parts;

setting the initial fitness value as one fitness value of one third rule for each third rule; and adjusting each of the fitness values in the third classifier system according to a reinforcement learning.

38. An automatic arrangement method according to claim 36 in which the step of judging in a third classifier system further includes the step of:

adjusting each of the fitness values set to the third rules in the third classifier system according to a reinforcement learning.

39. An automatic arrangement method according to claim 36 in which the step of judging in a third classifier system further includes the steps of:

changing each of the third rules respectively composed of one third condition rule and one third action rule in the third classifier system according to a genetic algorithm; and adjusting each of the fitness values set to the third rules in the third classifier system according to a reinforcement learning.

40. An automatic arrangement method according to claim 18 in which the step of changing the arranged position includes the steps of:

producing an evaluation value according to the arranged positions of the electric parts and the arrangement area;

judging that the arranged positions of the electric parts are set in an optimum arrangement in cases where the evaluation value is equal to or lower than a reference value;

judging that the arranged positions of the electric parts are not set in an optimum arrangement in cases where the evaluation value is higher than the reference value;

revising the first, second and third classifying systems according to a genetic algorithm or a reinforcement learning to produce a revised evaluation value equal to or lower than the reference value.

41. An automatic arrangement system for automatically arranging a plurality of electric parts providing circuitry of an electric device at an optimum arrangement on a printed circuit board, the system comprising:

element information receiving means for receiving element information indicating the plurality of electric parts;

electric part storing means for storing one or more attributes of each electric part received by the element information receiving means;

electric part arranging order determining means, having a first classifier system, for determining an arranging order of the received electric parts in the first classifier system according to the attributes of the electric parts;

arranging position determining means, having a second classifier system, for determining an arranging position determining method for each electric part in the arranging order of the electric parts in the second classifier system according to the attributes and determining an arranged position of each electric part in an arrangement area or an area surrounding the arrangement area on the printed circuit board according to the arranging position determining method;

arranged position change judging means, having a third classifier system, for judging in the third classifier system whether or not the change of the arranged position of each electric part is required according to the attributes and the arranged positions of the electric parts and producing a position changing method for one electric part in the third classifier system in cases where it is judged that the change of the arranged position of each electric part is required;

electric part arranging means for changing the arranged position of one electric part according to the position changing method, in cases where it is judged in the third classifier system that the change of the arranged position of each electric part is required, to determine the arranged positions of the electric parts as the optimum arrangement in the arrangement area; and outputting means for outputting information indicating the determined optimum arrangement through an outputting device.

42. An automatic arrangement system according to claim 41 in which the first classifier system of the electric part arranging order determining means comprises a plurality of first rules respectively corresponding to one electric part, wherein each first rule of one electric part comprises:

a first condition rule for indicating a group of one or more attributes of the electric part, a plurality of particular first rules of a plurality of particular first condition rules, which indicate a plurality of groups of attributes of the electric parts received by the part information receiving means, being activated; and a first action rule for indicating an arrangement priority degree of the electric part, the arranging order of the electric parts being determined according to the arrangement priority degrees indicated by a plurality of particular first action rules of the particular first rules.

43. An automatic arrangement system according to claim 42, further comprising:

first learning means for performing the learning of the first classifier system to change each of the first rules according to a genetic algorithm.

44. An automatic arrangement system according to claim 42, further comprising:

initial rule producing means for producing an initial condition rule and an initial action rule of each first rule according to past arrangement examples of the electric parts, setting the initial condition rule as one first condition rule of one first rule for each first rule, setting the initial action rule as one first action rule of one first rule for each first rule; and learning means for performing the learning of the first classifier system to change each of the first rules in the first classifier system according to a genetic algorithm.

45. An automatic arrangement system according to claim 41 in which the second classifier system of the arranging position determining means comprises a plurality of second rules respectively corresponding to one electric part, wherein each second rule of one electric part comprises:

a second condition rule for indicating a group of one or more attributes of the electric part, a particular second rule of a particular second condition rule, which indicates a particular group of attributes of one electric part, being activated for each electric part in the arranging order of the electric parts; and a second action rule for indicating one arranging position determining method applied for the electric part, the arranging position determining method indicated by a particular second action rule of one activated particular second rule being determined for each electric part in the arranging order of the electric parts.

46. An automatic arrangement system according to claim 45, further comprising:

learning means for performing the learning of the second classifier system to change each of the second rules according to a genetic algorithm.

47. An automatic arrangement system according to claim 45, further comprising:

initial rule producing means for producing an initial condition rule and an initial action rule of each second rule according to past arrangement examples of the electric parts, setting the initial condition rule as one second condition rule of one second rule for each second rule, setting the initial action rule as one second action rule of one second rule for each second rule; and learning means for performing the learning of the second classifier system to change each of the second rules in the second classifier system according to a genetic algorithm.

48. An automatic arrangement system according to claim 41 in which the third classifier system of the arranged position change judging means comprises a plurality of third rules respectively corresponding to one electric part, wherein each third rule of one electric part comprises:

a third condition rule for indicating an arrangement condition of the electric part, a particular third rule of a particular third condition rule, which indicates a particular arrangement condition of one electric part, being activated for each electric part in the arranging order of the electric parts; and a third action rule for indicating one judgement about a position change and one position changing method applied for the electric part, a position change of one electric part being judged according to the judgement about a position change indicated by a particular third action rule of one activated particular third rule, and the position changing method indicated by the particular third action rule being produced for each electric part in the arranging order of the electric parts.

49. An automatic arrangement system according to claim 48, further comprising:

learning means for performing the learning of the third classifier system to change each of the third rules according to a genetic algorithm.

50. An automatic arrangement system according to claim 48, further comprising:

initial rule producing means for producing an initial condition rule and an initial action rule of each third rule according to past arrangement examples of the electric parts, setting the initial condition rule as one third condition rule of one third rule for each third rule, setting the initial action rule as one third action rule of one third rule for each third rule; and learning means for performing the learning of the third classifier system to change each of the third rules in the third classifier system according to a genetic algorithm.

51. An automatic arrangement system according to claim 41, further comprising:

evaluation value calculating means for calculating an evaluation value from the arranged positions of the electric parts determined by the electric part arranging means and the arrangement area;

control means for judging whether or not the learning of the first, second and third classifier systems is required according to the evaluation value calculated by the evaluation value calculating means; and learning means for revising the first, second and third classifier systems according to a genetic algorithm or a reinforcement learning.

52. An automatic arrangement system according to claim 41 in which the first classifier system of the electric part arranging order determining means comprises a plurality of first rules respectively corresponding to one electric part, wherein each first rule of one electric part comprises:

a first condition rule for indicating a group of one or more attributes of the electric part, one or more first rules of one or more first condition rules, which indicate the same group of attributes of each electric part received by the part information receiving means, being activated;

a first action rule for indicating an arrangement priority degree of the electric part, one or more arrangement priority degrees of one or more first action rules of the activated first rules being selected for each electric part; and a fitness value for indicating the fitness of the electric part, a particular first rule being selected from the activated first rules at a selection probability proportional to the fitness value of the particular first rule for each electric part, and the arranging order of the electric parts being determined according to the arrangement priority degrees indicated by a plurality of particular first action rules of the particular first rules.

53. An automatic arrangement system according to claim 52 further comprising:

first learning means for performing the learning of the first classifier system to adjust each of the fitness values of the first rules according to a reinforcement learning.

54. An automatic arrangement system according to claim 41 in which the second classifier system of the arranging position determining means comprises a plurality of second rules respectively corresponding to one electric part, wherein each second rule of one electric part comprises:

a second condition rule for indicating a group of one or more attributes of the electric part, one or more second rules of one or more second condition rules, which indicate the same particular group of attributes of one electric part, being activated for each electric part in the arranging order of the electric parts;

a second action rule for indicating one arranging position determining method applied for the electric part; and a fitness value for indicating the fitness of the electric part, a particular second rule being selected from the activated second rules at a selection probability proportional to the fitness value of the particular second rule for each electric part, and the arranging position determining method indicated by a particular second action rule of the particular second rule being determined for each electric part in the arranging order of the electric parts.

55. An automatic arrangement system according to claim 54 further comprising:

second learning means for performing the learning of the second classifier system to adjust each of the fitness values of the second rules according to a reinforcement learning.

56. An automatic arrangement system according to claim 41 in which the third classifier system of the arranged position change judging means comprises a plurality of third rules respectively corresponding to one electric part, wherein each third rule of one electric part comprises:

a third condition rule for indicating an arrangement condition of the electric part, one or more third rules of one or more third condition rules, which indicate the same particular arrangement condition of one electric part, being activated for each electric part in the arranging order of the electric parts; and a third action rule for indicating one judgement about a position change and one position changing method applied for the electric part; and a fitness value for indicating the fitness of the electric part, a particular third rule being selected from the activated third rules at a selection probability proportional to the fitness value of the particular third rule for each electric part, a position change of one electric part being judged according to the judgement about a position change indicated by a particular third action rule of the activated particular third rule, and the position changing method indicated by the particular third action rule being produced for each electric part in the arranging order of the electric parts.

57. An automatic arrangement system according to claim 56 further comprising: learning means for performing the learning of the third classifier system to adjust each of the fitness values of the third rules according to a reinforcement learning.

58. A recording medium for recording a method for controlling a computer to implement a sequence of steps of a software program for automatically arranging a plurality of electric parts of an electric device in an optimum arrangement on a printed circuit board, the sequence of steps comprising:

determining an arranging order of the plurality of electric parts in a first classifier system according to attributes of the electric pars and one or more connection conditions among the electric parts;

determining an arranging position determining method for each electric part in the arranging order in a second classifier system according to the attributes and the connection conditions;

determining an arranged position of each electric part in an arrangement area or an area surrounding the arrangement area on the printed circuit board according to the arranging position determining method determined for each electric part in the arranging order;

judging in a third classifier system whether or not the change of the arranged position of each electric part is required according to the attributes and the arranged positions of the electric parts and the connection conditions among the electric parts in the arranging order;

detecting a position changing method for one electric part in the third classifier system in cases where it is judged that the change of the arranged position of each electric part is required; and changing the arranged position of one electric part according to the position changing method for each electric part, in cases where it is judged that the change of the arranged position is required, to determine the arranged positions of the electric parts as the optimum arrangement in the arrangement area.

59. A method for automatically arranging a plurality of particular composing elements at an optimum arrangement in an enclosed field, comprising the steps of:

preparing a plurality of past examples in a storing unit, the past examples respectively indicating a past arrangement of a set of composing elements, each past example of composing elements being composed of position information indicating positions of the set of composing elements and attribute information indicating attributes of the set of composing elements;

also preparing in the storing unit information indicative of a potential function including one or more parameters for indicating a potential energy of each composing element of the set of composing elements;

selecting a plurality of particular past examples corresponding to a plurality of particular composing elements from the past examples stored in the storing unit;

automatically determining values of the one or more parameters of the potential function according to the particular past examples for each particular composing element;

differentiating each of the potential functions to obtain a force exerted on each particular composing element to be arranged in the enclosed field;

changing, under calculation, a position of each particular composing element to be arranged in the enclosed field according to the force so as to decrease a total potential energy obtained by summing up the potential energies of the particular composing elements, each potential energy of one particular composing element being obtained by determining a position of the particular composing element in one potential function;

determining a particular arrangement of the particular composing elements placed at the changed positions as the optimum arrangement; and outputting the determined optimum arrangement through an outputting device.

60. A method for automatically arranging a plurality of particular composing elements at an optimum arrangement in an enclosed field, comprising the steps of:

preparing a plurality of past examples in a storing unit, the past examples respectively indicating a past arrangement of a set of composing elements, each past example being composed of past position information indicating past positions of the set of composing elements, past attribute information indicating attributes of the set of composing elements and past connection information indicating a direct connection of each composing element with other composing elements or another composing element;

also preparing in the storing unit a prototype of a total potential function indicating a total potential energy of the set of composing elements;

inputting particular element information of the plurality of particular composing elements, the particular element information including particular attribute information, indicating attributes of the particular composing elements, and particular connection information, indicating a direct connection of each particular composing element with at least one other particular composing element;

selecting a plurality of particular past examples corresponding to the particular composing elements from the past examples stored in the storing unit, the particular past examples including particular past position information of the particular composing elements, particular past attribute information of the particular composing elements and particular past connection information of the particular composing elements;

producing a total past potential function corresponding to the particular composing elements from the prototype of the total potential function according to the particular past attribute information and the particular past connection information;

setting values of one or more parameters included in the total past potential function as a set of parameter values;

calculating a total past potential energy of the particular composing elements from the total past potential function by giving both of:
 one set of parameter values to the total past potential function to determine an equation of the total past potential function; and
 particular past positions of the particular composing elements indicated by the particular past position information to the equation of the total past potential function to solve the equation each time the set of parameter values is set while changing the parameter values;

determining a particular set of parameter values on condition that the total past potential energy calculated according to the particular set of parameter values is minimized;

producing the total potential function corresponding to the particular composing elements from the prototype of the total potential function according to the particular attribute information and the particular connection information;

giving the particular set of parameter values to the total potential function to determine a particular equation of the total potential function;

determining a particular set of positions of the particular composing elements on condition that a particular total potential energy of the particular composing elements obtained from the particular equation of the total potential function is minimized by giving the particular set of positions to the particular equation of the total potential function;

adopting a particular arrangement of the particular composing elements determined by the particular set of positions of the particular composing elements as the optimum arrangement of the particular composing elements; and outputting the adopted optimum arrangement through an outputting device.

* * * * *